US006765715B1

(12) United States Patent
DiJaili et al.

(10) Patent No.: US 6,765,715 B1
(45) Date of Patent: Jul. 20, 2004

(54) OPTICAL 2R/3R REGENERATION

(75) Inventors: Sol P. DiJaili, Moraga, CA (US);
Jeffrey D. Walker, El Cerrito, CA
(US); John M. Wachsman, Dublin, CA
(US)

(73) Assignee: Finisar Corporation, Sunnyvale, CA (US)

( * ) Notice: Subject to any disclaimer, the term of this patent is extended or adjusted under 35 U.S.C. 154(b) by 109 days.

(21) Appl. No.: 10/029,523

(22) Filed: Dec. 21, 2001

Related U.S. Application Data

(60) Provisional application No. 60/274,496, filed on Mar. 9, 2001, provisional application No. 60/274,474, filed on Mar. 9, 2001, and provisional application No. 60/274,437, filed on Mar. 9, 2001.

(51) Int. Cl.[7] .............................................. H01S 3/00
(52) U.S. Cl. ...................................... 359/344; 398/175
(58) Field of Search ........................... 398/175; 359/344

(56) References Cited

U.S. PATENT DOCUMENTS

| | | | |
|---|---|---|---|
| 3,467,906 A | 9/1969 | Cornely et al. ............... 330/4.3 |
| 3,828,231 A | 8/1974 | Yamamoto .................... 357/30 |
| 4,794,346 A | 12/1988 | Miller .......................... 330/4.3 |
| 5,299,054 A | 3/1994 | Geiger ......................... 359/251 |
| 5,305,412 A | 4/1994 | Paoli ............................ 385/122 |
| 5,436,759 A | 7/1995 | Dijaili et al. ................. 359/333 |
| 5,604,628 A | 2/1997 | Parker et al. ................. 359/344 |
| 5,754,571 A | 5/1998 | Endoh et al. ................. 372/20 |
| 5,761,228 A * | 6/1998 | Yano ............................ 372/26 |
| 5,771,320 A | 6/1998 | Stone ........................... 385/16 |
| 5,778,132 A | 7/1998 | Csipkes et al. .............. 385/135 |
| 5,805,322 A | 9/1998 | Tomofuji ..................... 359/177 |
| 5,831,752 A * | 11/1998 | Cotter et al. ................. 359/135 |
| 5,999,293 A | 12/1999 | Manning ...................... 359/139 |
| 6,061,156 A | 5/2000 | Takeshita et al. ............ 359/117 |
| 6,115,517 A | 9/2000 | Shiragaki et al. ............. 385/24 |
| 6,128,115 A | 10/2000 | Shiragaki ..................... 359/128 |
| 6,317,531 B1 | 11/2001 | Chen et al. ................... 385/17 |
| 6,333,799 B1 | 12/2001 | Bala et al. .................... 359/128 |
| 6,335,992 B1 | 1/2002 | Bala et al. .................... 385/17 |

FOREIGN PATENT DOCUMENTS

| | | | | |
|---|---|---|---|---|
| JP | 56006492 | | 1/1981 | ............. H01S/3/18 |
| WO | WO 91/17474 | * | 11/1991 | |

OTHER PUBLICATIONS

Alcatel, "Alcatel Optronics Introduces as Gain–Clamped Semiconductor Optical Amplifier," *Press Release for Immediate Publication,* OFC '98, San Jose, 1 unnumbered page, (Feb. 1998).

Diez, S., Ludwig, R., and Weber, H.G., "All–Optical Switch for TDM and WDM/TDM Systems Demonstrated in a 640 Gbit/s Demultiplexing Experiment," Electronics Letters, vol. 34, No. 8, pgs. 803–805, Apr. 16, 1988.

Diez, S., Ludwig, R., and Weber, H.G., Gain–Transparent SOA–Switch for High–Bitrate OTDM Add/Drop Multiplexing, IEEE Photonics Technology Letters, vol. 11, No. 1, pgs. 60–62, Jan. 1999.

Diez, S., Ludwig, R., Patzak, E., and Weber, H.G., "Novel Gain–Transparent SOA–Switch for High Bitrate OTDM Add/Drop Multiplexing," ECOC'98, vol. 1, pp. 461–462, Sep. 1998.

Dorgeuille, F., Noirie, L., Faure, J–P., Ambrosy, A., Rabaron, S., Boubal, F., Schilling, M., and Artigue, C., "1.28 Tbit/s Throughput 8x8 Optical Switch Based on Arrays of Gain–Clamped Semiconductor Optical Amplifier Gates," Optical Fiber Communication Conference, vol. 4, pp. 221–223, Mar. 2000.

(List continued on next page.)

*Primary Examiner*—Mark Hellner
(74) *Attorney, Agent, or Firm*—Workman Nydegger

(57) ABSTRACT

An optical 2R/3R regenerator is described. One or more LSOAs are used as part of the optical 2R/3R register.

27 Claims, 16 Drawing Sheets

OTHER PUBLICATIONS

Dorgeuille, F., Lavigne, B., Emergy, J.Y., Di Maggio, M., Le Bris, J., Chiaroni, D., Renaud, M., Baucknecht, R., Schneibel, H.P., Graf, C., and Melchoir, H., "Fast Optical Amplifier Gate Array for WDM Routing and Switching Applications," OFC '98 Technical Digest, pp. 42–44, 1998.

Doussiere, P., Jourdan, A. Soulage, G., Garabédian, P. Graver, C., Fillion, T., Derouin, E., and Leclerc, D., "Clamped Gain Travelling Wave Semiconductor Optical Amplifier for Wavelength Division Multiplexing Application," IEEE, US, vol. Conf. 14, pp. 185–186, New York, Sep. 14, 1994.

Evankow, Jr., J.D., and Thompson, R. A., "Photonic Switching Modules Designed with Laser Diode Amplfiers," IEEE, Journal on Selected Areas in Communications, vol. 6, No. 7, pp. 1087–1095, Aug. 1988.

Fernier, B., Brosson, P., Bayart, D., Doussière, P., Beaumont, R., Leblond, F., Morin, P., Da Loura, G., Jacquet, J., Derouin, E., and Garabedian, P., "Fast (300 ps) Polarization Insensitive Semiconductor Optical Amplifier Switch with Low Driving Current (70 mA),"Semicondutor Laser Conference, Conference Digest, 13$^{th}$ IEEE International, pp. 130–131, Sep. 21–25, 1992.

Fouquet, J.E., Venkatesh, S., Troll, M., Chen, D., Schiaffino, S., and Barth, P.W., "Compact, Scalable Fiber Optic Cross–Connect Switches," IEEE, 1999 Digest of the LEOS Summer Topical Meetings, pp. 59–60, 1999.

Ibrahim, M. M., "Photonic Switch Using Surface–Emitting Laser Diode and APD," 16$^{th}$ National Radio Science Conference, NRSC'99, pp. 1–8, Ain Shams University, Cairo, Egypt, Feb. 23–25, 1999.

Jeong, G., and Goodman, J.W., "Gain Optimization in Switches Based on Semiconductor Optical Amplifiers," Journal of Lightwave Technology, Vo. 13, No. 4, pp. 598–605, Apr. 1995.

Kitamura, S., Hatakeyama, H., and Hamamoto, K., "Spot–Size Converter Integrated Semiconductor Optical Amplifiers for Optical Gate Applications," IEEE Journal of Quantum Electronics, vol. 35, No. 7, pp. 1067–1074, Jul. 1999.

Leuthold, J., Besse, P.A., Eckner, J., Gamper, E., Dülk, M., and Melchoir, H., "All–Optical Space Switches with Gain and Principally Ideal Extinction Ratios," IEEE Journal of Quantum Electronics, vol. 34, No. 4, pp. 622–633, Apr. 1998.

McAdams, L.R., Weverka, R.T., and Cloonan, J., "Linearizing High Performance Semiconductor Optical Amplifiers: Techniques and Performance," LEOS Presentation, pp. 363–364, 1996.

Mørk, J., and Mecozzi, A., "Semiconductor Devices for All–Optical Signal Processing: Just How Fast Can They Go?," IEEE Lasers and Electro–Optics Society 1999 12$^{th}$ Annual Meeting, LEOS'99, vol. 2, pp. 900–901, Nov. 8–11, 1999.

Mutalik, V. G., van den Hoven, G., and Tiemeijer, L., "Analog Performance of 1310–nm Gain–Clamped Semiconductor Optical Amplifiers," OFC '97 Technical Digest, pp. 266–267, 1997.

Panajotov, K., Ryvkin, B., Peeters, M., Verschaffelt, G., Danckaert, J., Thienpont, H., Veretennicoff, I., "Polarisation Switching in Proton–Implanted VCSELs," 1999 Digest of the LEOS Summer Topical Meetings, pp. 55–56, Jul. 26–30, 1999.

Qui, B.C., Ke, M.L., Kowalski, O.P., Bryce, A.C., Aitchison, J.S., Marsh, J.H., Owen, M., White, I.H., and Penty, R.V., "Monolithically Integrated Fabrication of 2x2 and 4x4 Crosspoint Switches Using Quantum Well Intermixing," 2000 International Conference on Indium Phosphide and Related Materials, Conference Proceedings, pp. 415–418, May 14–18, 2000.

Scheuer, J., Arbel, D., and Orenstein, M., "Nonlinear On–Switching of High Spatial Frequency Patterns in Ring Vertical Cavity Surface Emitting Lasers," 1999 IEEE LEOS Annual Meeting Conference Proceedings, 12$^{th}$ Annual Meeting, IEEE Lasers and Electro–Optics Society 1999 Annual Meeting, vol. 1, pp. 123–124, Nov. 8–9, 1999.

Soto, H., Erasme, D., and Guekos, G., "All–Optical Switch Demonstration Using a Birefringence Effect in a Semiconductor Optical Amplifier," IEEE CLEO, Pacific Rim '99, pp. 888–889, 1999.

Soulage, G., Doussière, P., Jourdan, A., and Sotom, M., "Clamped Gain Travelling Wave Seimconductor Optical Amplifier as a Large Dynamic Range Optical Gate," Alcatel Alsthom Recherche, route de Nozay, 91460 Marcoussis (France), 4 unnumbered pages, undated.

Tai, C., and Way, W.I., "Dynamic Range and Switching Speed Limitations of an N x N Optical Packet Switch Based on Low–Gain Semiconductor Optical Amplifiers," IEEE Journal of Lightwave Technology, vol. 14, No. 4, pp. 525–533, Apr. 4, 1996.

Tiemeijer, L.F., Walczyk, S., Verboven, A.J.M., van den Hoven, G.N., Thijs, P.J.A., van Dongen, T., Binsma, J.J.M., and Jansen, E.J., "High–Gain 1310 nm Semiconductor Optical Amplifier Modules with a Built–in Amplified Signal Monitor for Optical Gain Control," IEEE Photonics Technology Letters, vol. 9, No. 3, pp. 309–311, Mar. 1997.

Toptchiyski, G., Kindt, S., and Petermann, K., "Time–Domain Modeling of Semiconductor Optical Amplifiers for OTDM Applications," *IEEE Journal of Lightwave Technology*, vol. 17, No. 12, pp. 2577–2583, Dec. 1999.

Tiemeijer, L.F., Thijs, P.J.A., Dongen, T.v., Binsma, J.J.M., Jansen, E.J., van Helleputte, H.R.J.R., "Reduced Intermodulation Distortion in 1300 nm Gain–Clamped MQW Laser Amplifiers," IEEE Photonics Technology Letters, vol. 7, No. 3, pp. 284–286, Mar. 1995.

van Roijen, R., van der Heijden, M.M., Tiemeijer, L.F., Thijs, P.J.A., van Dongen, T., Binsma, J.J.M., and Verbeek, B.H., "Over 15 dB Gain from a Monolithically Integrated Optical Switch with an Amplifier," IEEE Photonics Technology Letters, vol. 5, No. 5, pp. 529–531, May 1993.

Yoshimoto, N., Magari, K., Ito, T., Kawaguchi, Y., Kishi, K., Kondo, Y., Kadota, Y., Mitomi, O., Yoshikuni, Y., Hasumi, Y., Tohmori, Y., and Nakajima O., "Spot–Size Converted Polarization–Insensitive SOA Gate with a Vertical Tapered Submicrometer Stripe Structure," IEEE Photonics Technology Letters, vol. 10, No. 4, pp. 510–512, Apr. 4, 1998.

Walker, J.D., et al., "A Gain–Clamped, Crosstalk Free, Vertical Cavity Lasing Semiconductor Optical Amplifier for WDM Applications," Summaries of the papers presented at the topical meeting, Integrated Photonics Search; 1996 Technical Digest Series; Proceedings of Integrated Photonics; Boston, MA, 29.04–02.05 1996, vol. 6, pp. 474–477, 1996.

\* cited by examiner

OPTICAL 2R/3R REGENERATION

RELATED APPLICATIONS

This application claims priority under 35 U.S.C. §119(e) from U.S. patent application Ser. No. 60/274,496, entitled, "Optical 2R/3R Regeneration," by Sol P. DiJaili, filed Mar. 9, 2001, which is incorporated by reference in its entirety. This application also claims priority under 35 U.S.C. §119(e) from U.S. patent application Ser. No. 60/274,474, entitled, "Optical Astable Multivibrator Using a VLSOA," by Sol P. DiJaili, filed Mar. 9, 2001, which is incorporated by reference in its entirety. This application also claims priority under 35 U.S.C. §119(e) from U.S. patent application Ser. No. 60/274,437, entitled, "Fast Optical Digital Circuits," by Jeffrey D. Walker and Sol P. DiJaili, filed Mar. 9, 2001, which is incorporated by reference in its entirety.

INTRODUCTION

1. Field of the Invention

This invention relates generally to optical 2R/3R regeneration. More particularly, it relates to optical 2R/3R regeneration utilizing a vertically lasing semiconductor optical amplifier (VLSOA).

2. Description of Related Technologies

As a result of continuous advances in technology, particularly in the area of networking such as the Internet, there is an increasing demand for communications bandwidth. For example, the transmission of data over a telephone company's trunk lines, the transmission of images or video over the Internet, the transfer of large amounts of data as might be required in transaction processing, or videoconferencing implemented over a public telephone network typically require the high speed transmission of large amounts of data. As applications such as these become more prevalent, the demand for communications bandwidth capacity will only increase.

Optical fiber is a transmission medium that is well suited to meet this increasing demand. Optical fiber has an inherent bandwidth that is much greater than metal-based conductors, such as twisted pair or coaxial cable; and protocols such as the SONET optical carrier (OC) protocols have been developed for the transmission of data over optical fibers.

Fiber optic communications systems transmit information optically at very high speeds over optical fibers. A typical communications system includes a transmitter, an optical fiber, and a receiver. The transmitter incorporates information to be communicated into an optical signal and transmits the optical signal via the optical fiber to the receiver. The receiver recovers the original information from the received optical signal. In these systems, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers are used to compensate for attenuations. However, even with amplification, the optical signal degrades. Noise and other factors can result in a distortion of the optical signal.

2R/3R regeneration is used to restore signals that have been degraded. 2R regeneration stands for reshaping and retransmission of the signal, and 3R adds retiming of the signal. In the past, 2R/3R regeneration has been accomplished through optical-electrical-optical ("OEO") systems and optical systems that use Mach Zhender modulators.

In an OEO system, the signal is converted from optical to electrical, 2R/3R regenerated electrically, and finally converted back to an optical signal. Therefore, OEO systems have the drawbacks of being relatively large, complex and expensive. In addition, optical systems are generally capable of greater speeds than electrical systems. Therefore, an OEO system limits the overall system to the speed of the electronics, rather than allowing the inherent speed of the optical system to be fully utilized.

Mach Zhender systems also have drawbacks. Each Mach Zhender uses multiple optical amplifiers and requires an independent second input. Therefore, these systems have the drawbacks of being relatively large, complex and expensive.

SUMMARY OF THE INVENTION

The present invention can reshape, retime, and retransmit an input optical signal.

One embodiment reshapes an input optical signal. The input optical signal is received at an input of an optical one-input flip-flop. A bias signal is also received at the input of the optical one-input flip-flop. When the bias signal combined with the input optical signal is below a depletion threshold of the optical one-input flip-flop, the output of the optical one-input flip-flop is low. When the bias signal combined with the input optical signal is above a depletion threshold of the optical one-input flip-flop, the output of the optical one-input flip-flop is high. The optical one-input flip-flop outputs the reshaped input optical signal.

Another embodiment recovers a clock signal from an input optical signal. The input optical signal is received at a first input of an optical AND gate. A clock signal from a variable oscillator is received at a second input of the optical AND gate. The optical AND gate outputs a feedback signal. A feedback controller receives the feedback signal and in response outputs a control signal. The variable oscillator receives the control signal and in response outputs the clock signal. In addition to being sent to the second input of the optical AND gate, the clock signal is the recovered clock signal.

Another embodiment retimes an input optical signal. The input optical signal is received at a first input of an optical AND gate. A clock signal, recovered from the input optical signal, is received at a second input of an optical AND gate. The optical AND gate outputs the retimed input optical signal.

In addition, some embodiments retransmit an input optical signal.

Other embodiments perform more than one of the above functions. For example, one embodiment reshapes an input optical signal, recovers a clock signal from the input optical signal, retimes the input optical signal, and retransmits the reshaped, retimed input optical signal.

BRIEF DESCRIPTION OF THE DRAWINGS

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Overview of Optical 2R/3R Regenerator

Figure 1:
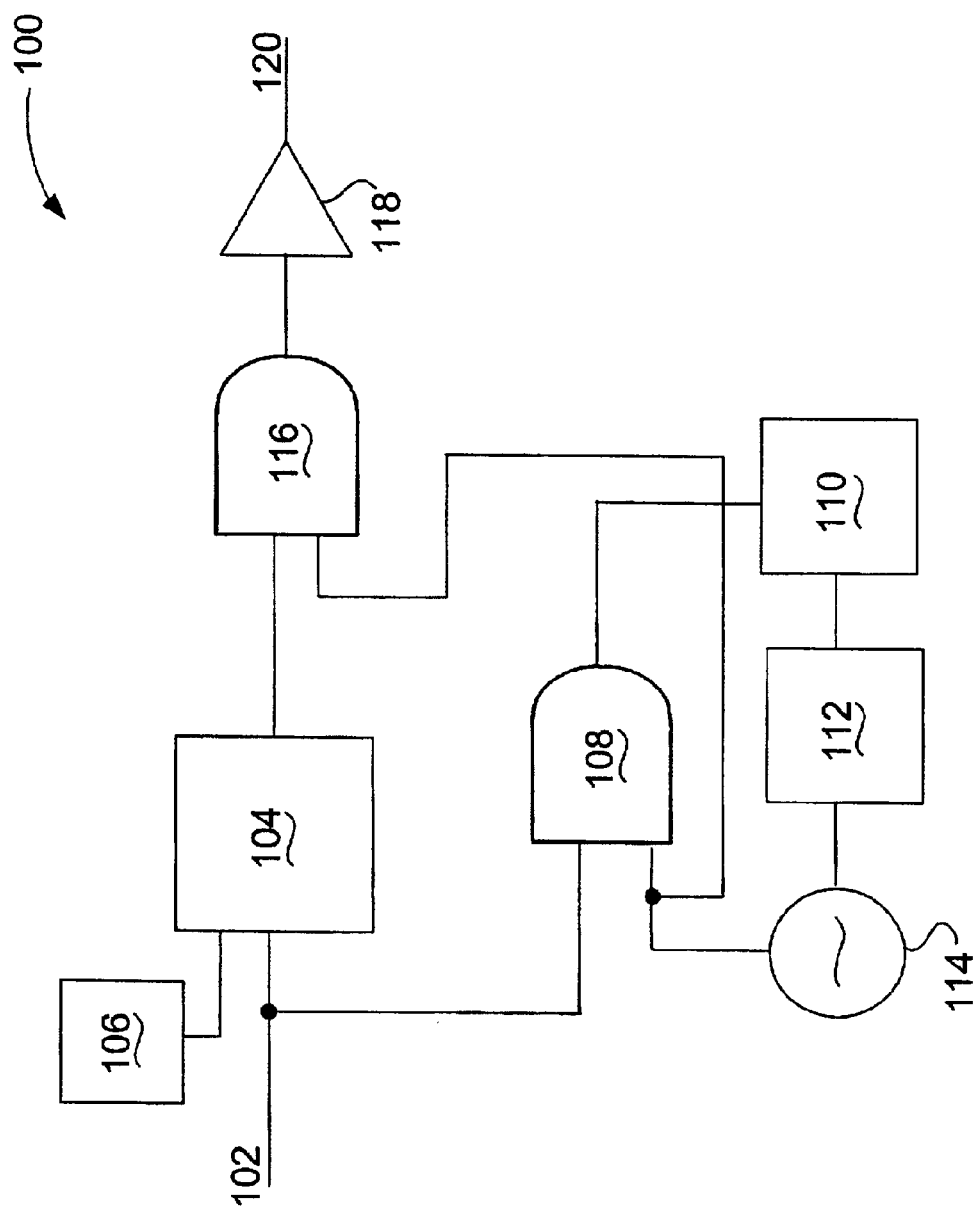
FIG. 1 is a block diagram of an optical 3R regenerator according to the present invention.

FIG. 1 is a block diagram of an optical 3R regenerator 100 according to the to present invention. The input signal 102 enters the system. A splitter, for example, a directional coupler, sends a portion of the input to an optical one-input flip-flop 104. A signal source 106 is a) used to generate the second input to the optical one-input flip-flop 104 and set a threshold for signal reshaping. The optical one-input flip-flop 104 combines the input signal 102 and the input from the signal source 106 and operates to reshape the signal. The output of the optical one-input flip-flop 104 is sent to a third OAND gate 116.

A second optical AND gate ("OAND" gate) 108 acts to help recover the clock signal from the input signal. A portion of the input signal 102 is sent to a second OAND gate 108 as a first input. The output from a variable oscillator 114 is sent to the second OAND gate 108 as the second input Both the input signal 102 and the signal from the variable oscillator 114 must be high in order for the output of the second OAND gate 108 to be high. Thus, if the output of the variable oscillator 114 and the input signal 102 are out of phase, the output of the second OAND gate 108 will be high for shorter periods of time than if both the output of the variable oscillator 114 and the input signal 102 were in phase. This fact is used to tune the variable oscillator 114 to the correct clock signal.

To tune the variable oscillator, a detector 10 is connected to the output of the second OAND gate 108. The detector 10 detects the optical output of the second OAND gate 108 and converts it into an electrical signal. The output of the detector 110 is sent to a low pass filter 112. The output of the low pass filter 112 is then sent to a variable oscillator 114 to control the frequency of the variable oscillator 114. If the input signal 102 and the variable oscillator 114 output signal are out of phase, the low pass filter 112 outputs a signal to the variable oscillator 114 that brings the variable oscillator 114 output signal into phase with the input signal 102. Thus, the detector 110 in combination with the low pass filter 112 functions as a feedback controller. The variable oscillator 114 outputs a clock signal with a frequency controlled by the signal from the low pass filter 112. In one embodiment, the variable oscillator 114 accepts an electrical signal to control the frequency of the output, and outputs an optical signal. In this embodiment, the variable oscillator 114 may be, for example, an optical astable multivibrator using a VLSOA. In another embodiment, the variable oscillator 114 outputs an electrical signal which is then input to a source (not shown) which converts the signal from the electrical domain to the optical domain and outputs the clock signal as an optical signal. The low pass filter 112 acts to provide feedback to adjust the frequency of the variable oscillator 114 higher or lower until the clock signal output form the variable oscillator 114 is in phase with the input signal 102.

Thus, the output of the variable oscillator 114 is the recovered clock signal. The output of the variable oscillator 114 is connected to the second input of the third OAND gate 116 if the output of the variable oscillator 114 is an optical signal. Alternatively the output of an optical source (not shown) that converts an electrical output of the variable oscillator 114 to an optical signal is connected to the second input of the third OAND gate 116. The third OAND gate 116 combines the reshaped signal from the optical one-input flip-flop 104 and the recovered clock signal to retime the signal. Thus, the output signal of the third OAND gate 116 is the input signal reshaped and retimed. The signal is then retransmitted with an optical amplifier 118. Alternatively, the third OAND gate 116 provides sufficient amplification that the separate optical amplifier 118 is not needed. Thus, the output signal 120 of the 3R regenerator 100 is the input signal reshaped, retimed, and retransmitted.

For a 2R regenerator, the input signal 102 and the output of the signal source 106 are input into the optical one-input flip-flop 104, which operates to reshape the signal. The signal is then retransmitted by an optical amplifier 118. Alternatively, the optical one-input flip-flop 104 provides sufficient amplification that a separate optical amplifier is not needed. The second and third OAND gates 108 and 116, the detector 110, the low pass filter 112, and the variable oscillator 114 are not needed in the 2R regenerator. The output signal of the 2R regenerator is the input signal reshaped and retransmitted.

Signal Reshaping

Figure 2A:
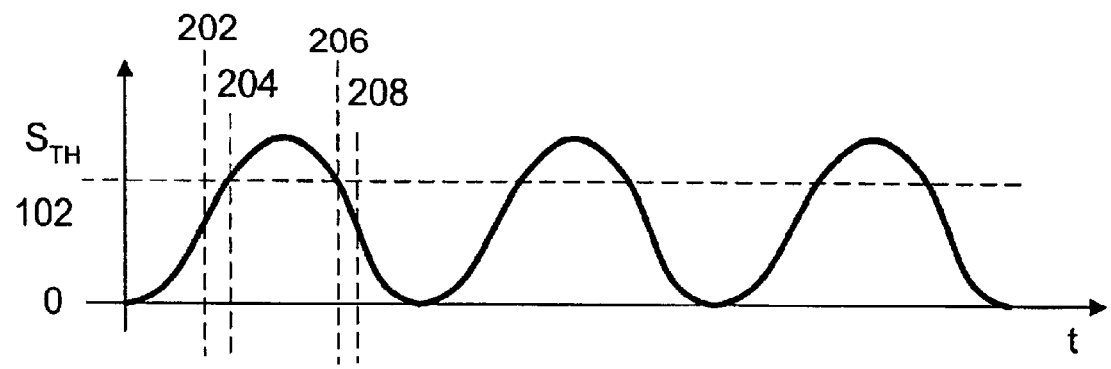
FIGS. 2(a) through 2(d) are graphs illustrating the reshaping operation performed by the first optical AND gate.

FIGS. 2(a) through 2(d) are graphs illustrating the reshaping operation performed by the optical one-input flip-flop 104. FIG. 2(a) shows the intensity of the input signal 102 as a function of time. The desired shape for the signal is a square wave. As seen in FIG. 2(a), the input signal 102 has lost much of its square wave form and should be reshaped.

The output of the optical one-input flip-flop 104 ideally is either high or low. When the input signal has a high enough intensity to meet or exceed a signal threshold $S_{TH}$ of the optical one-input flip-flop 104, the output of the optical one-input flip-flop 104 is high. When the input signal is below the signal threshold $S_{TH}$, the output of the optical one-input flip-flop 104 is low.

Figure 2B:
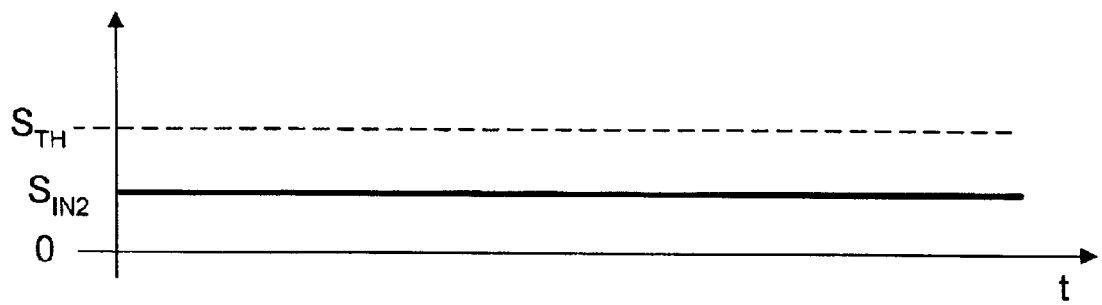

As seen in FIG. 2(a), a first input signal 102 varies, going above and below the signal threshold $S_{TH}$. In the example shown in FIG. 2(a), in order to correctly reshape the signal, it is desirable for the optical one-input flip-flop 104 output to go high when the signal 102 reaches the level attained in FIG. 2(a) at time 202 and return low when the signal 102 reaches the level attained in FIG. 2(a) at time 208. However, the input signal 102 does not reach the signal threshold $S_{TH}$ until time 204, and the input signal 102 falls below the signal threshold $S_{TH}$ at time 206. This would result in a square wave output of the optical one-input flip-flop 104 which does not stay at the high level as long as is desired. It is also possible for the input signal 102 to never reach the signal threshold $S_{TH}$, in which case the output of the optical one-input flip-flop 104 never goes high. Thus, a signal source 106 is used to adjust the level of the input signal 102. FIG. 2(b) is a graph of the signal from the signal source 106. As seen in FIG. 2(b), the signal source 106 provides a bias signal. The bias signal is combined with the input signal 102 and biases the input signal 102 so that the combined signal crosses the signal threshold $S_{TH}$ at the appropriate times.

Figure 2C:
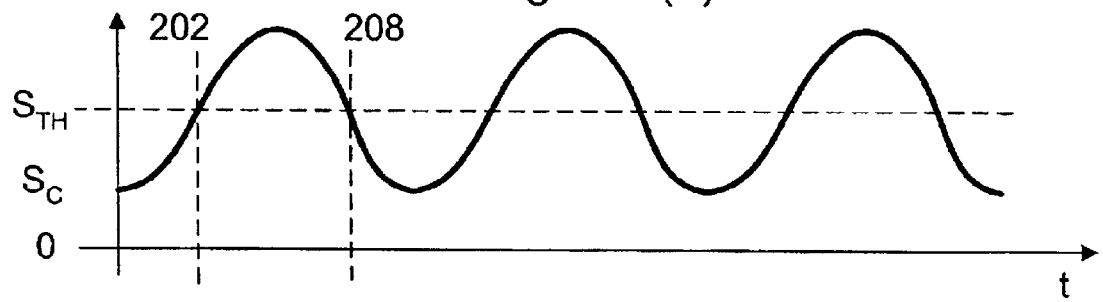

FIG. 2(c) is a graph of the combined input signal 102 and signal from the signal source 106. As seen in FIG. 2(c), the signal from the signal source 106 biases the input signal 102 so that the combined signal $S_C$ crosses the signal threshold $S_{TH}$ at the desired times 202 and 208.

Figure 2D:
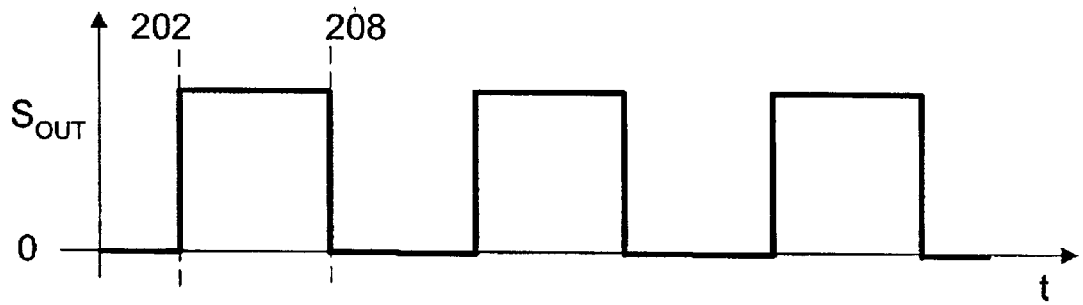

FIG. 2(d) is a graph of the output signal $S_{OUT}$ of the optical one-input flip-flop 104. Since the combined signal of FIG. 2(c) crosses the signal threshold $S_{TH}$ at time 202, the output signal $S_{OUT}$ of the optical one-input flip-flop 104 goes high at time 202. The combined signal of FIG. 2(c) goes below the signal threshold $S_{TH}$ at time 208, so the output signal $S_{OUT}$ of the optical one-input flip-flop 104 goes low at time 208. Thus, the optical one-input flip-flop 104 has reshaped the signal into a square wave. (Note that FIG. 2(d) is an idealized representation of the square wave. In actuality, the wave form is not totally square. Also hysteresis will modify the threshold signals: the $S_{TH}$ when transitioning from low to high will be different than when transitioning from high to low.)

In an alternate embodiment, no signal source 106 is used. The input signal 102 is input to the one-input optical flip-flop 104. The one-input optical flip-flop 104 outputs the reshaped signal. Instead of biasing an optical one-input flip-flop 104 with a biasing signal, the signal threshold of the one-input optical flip-flop 104 is set so that the input signal alone crosses the signal threshold at the appropriate times. Therefore, no biasing signal is necessary, and the output of the one-input optical flip-flop 104 is the reshaped signal, as shown in FIG. 2(d).

Clock Recovery

Figure 3A:
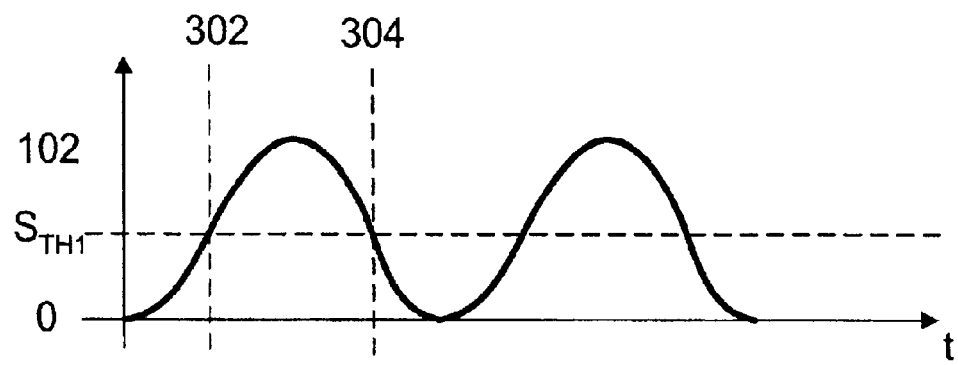
FIGS. 3(a) through 3(d) are graphs illustrating clock recovery operation.

FIGS. 3(a) through 3(d) are graphs illustrating clock recovery. FIG. 3(a) shows the input signal 102 as a function of time. The input signal 102 goes high at time 302 and returns low at time 304 (which correspond to times 202 and 208 of FIG. 2(a)), which is one-half clock cycle. The input signal 102 is one input to the second OAND gate 108. The output of the second OAND gate 108 ideally is either high or low. When both of the inputs to the second OAND gate 108 have a high enough intensity to meet or exceed signal thresholds ($S_{Th1}$ for the first input and $S_{Th2}$ for the second input), the output of the second OAND gate 108 is high. When one or both of the signals are below their signal threshold $S_{Th1}$, or $S_{Th2}$, the output of the second OAND gate 108 is low.

Figure 3B:
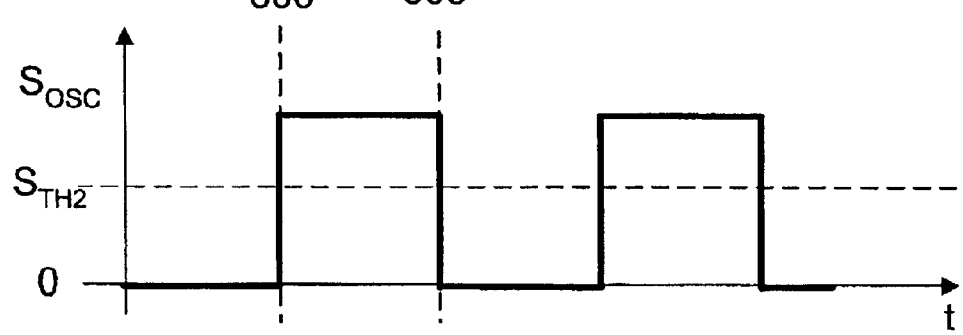

FIG. 3(b) shows the output of the variable oscillator 114 as a function of time. The output of the variable oscillator 114 is the second input to the second OAND gate 108. Both the input signal 102 and the output of the variable oscillator 114 must be high (over the threshold levels) in order for the output of the second OAND gate 108 to be high.

In FIG. 3(b), the output of the variable oscillator 114 is out of phase with the input signal 102. The half clock cycle shown in FIG. 3(a) begins at time 302 and ends at time 304. To be in phase, the output of the variable oscillator 114 should also go high at time 302 and return low at time 304. However, since the variable oscillator 114 is out of phase, the output goes high at time 306 and then returns low at time 308.

Figure 3C:
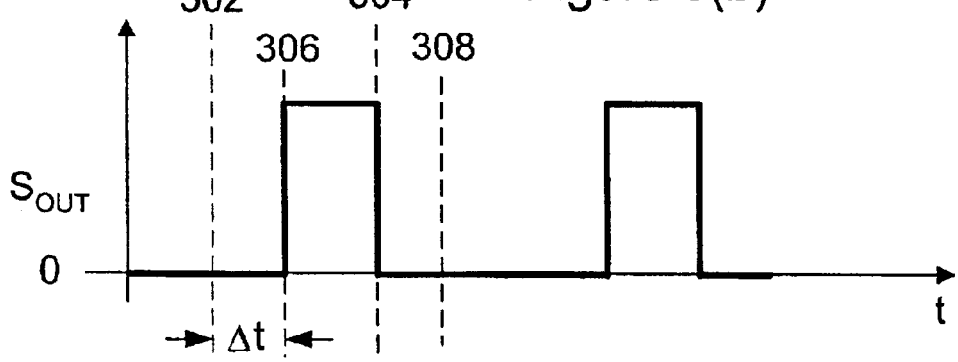

FIG. 3(c) shows the output of the second OAND gate 108 as a function of time. To correctly recover the clock, the output of the second OAND gate 108 should go high at time 302 and return low at time 304. However, the output of the variable oscillator 114 is out of phase with the input 102, so the output of the second OAND gate 108 is at the high level for a shorter time than it would be if the output of the variable oscillator 114 were in phase with the input signal 102. Since both the input signal 102 and the output of the variable oscillator 114 are high at time 306, this is when the output of the second OAND gate 108 goes high. Then, at time 304, the input signal 102 and the output of the variable oscillator 114 are no longer both high, so the output of the second OAND gate 108 returns low. Thus, there is a time difference Δt between when the output of the second OAND gate 108 should go high and when the output of the second OAND gate 108 actually does go high.

Figure 3D:
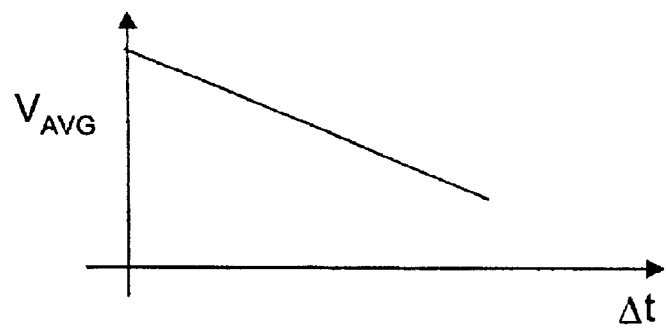

The output of the second OAND gate 108 is detected, converted to an electric signal by the detector 110, and sent to the low pass filter 112. The low pass filter 112 essentially acts as a voltage averager, and outputs the average voltage $V_{AVG}$ of the output of the second OAND gate 108. The greater the time difference Δ is, the smaller the average voltage is, as seen in FIG. 3(d). Thus, the low pass filter 112 acts to detect the phase difference between the input signal 102 and the output of the variable oscillator 114. The output of the low pass filter 112 is sent to the variable oscillator 114 and controls the frequency of the output of the variable oscillator 114.

The variable oscillator 114 and low pass filter 112 are configured so that when the input signal 102 and the output of the variable oscillator 114 are out of phase, the feedback from the low pass filter 112 acts to bring the variable oscillator 114 back into phase with the input signal 102. Thus, in operation, the output of the variable oscillator 114 is brought into phase with the input signal 102. The variable oscillator 114, when in phase with the input signal 102, provides the recovered clock signal. In some embodiments, a voltage difference amplifier or a set voltage bias point exists at the input to the variable oscillator 114 so that a static phase difference exists between the input 102 and the clock signal from the variable oscillator 114.

Signal Retiming

Figure 4A:
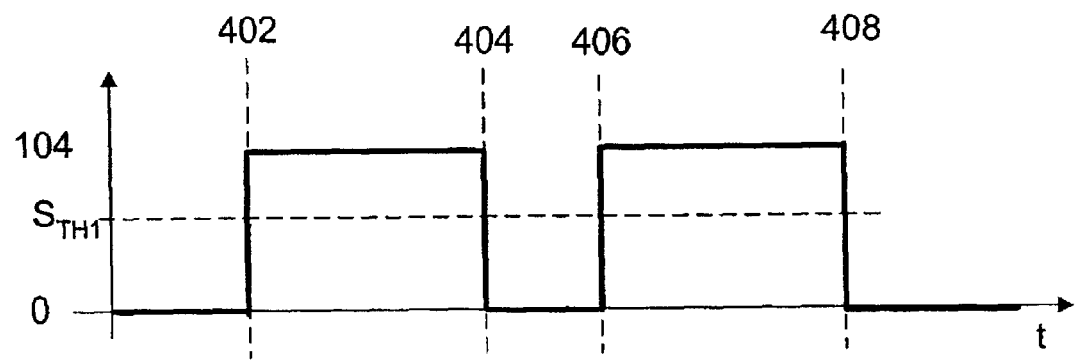
FIGS. 4(a) through 4(c) are graphs illustrating the retiming operation performed by the third optical AND gate.
Figure 4B:
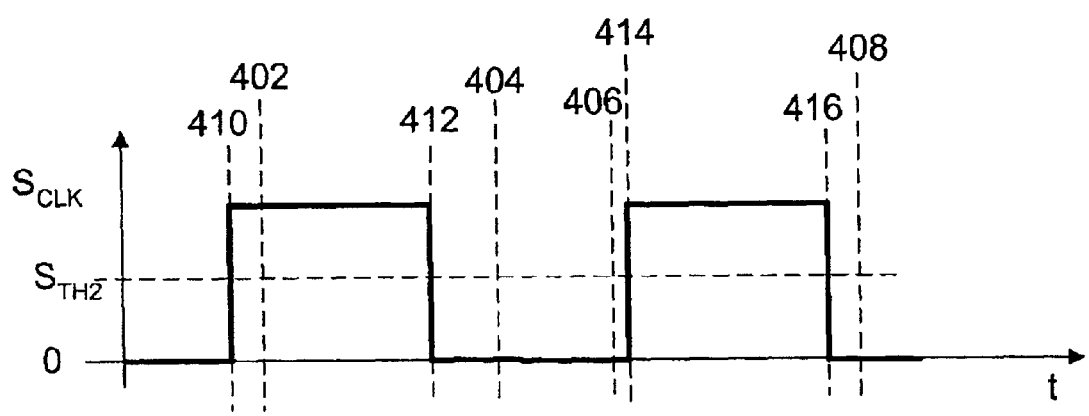
Figure 4C:
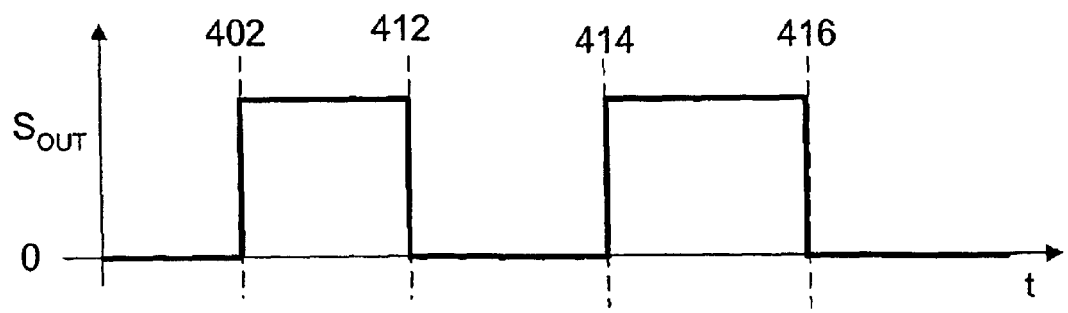

FIGS. 4(a) through 4(c) are graphs illustrating the retiming operation performed by the third OAND gate 116. FIG. 4(a) shows the reshaped signal output from the optical one-input flip-flop 104. As seen in FIG. 4(a), the reshaped signal starts low, goes high at time 402, goes low at time 404, goes high again at time 406 and returns low at time 408.

FIG. 4(b) shows the recovered clock signal $S_{CLK}$ output from the variable oscillator 114. As seen in FIG. 4(b), the recovered clock signal starts low, goes high at time 410, goes low at time 412, goes high again at time 414 and returns low at time 416.

As seen by comparing FIGS. 4(a) and 4(b), during transmission the input signal 102 has spread out and no longer is confined to the periods defined by the clock signal. The retiming operation rectifies this spread and ensures that the input signal 102 does not spread so much as to cause intersymbol interference (ISI), where one bit of information leaks into another and information can be lost.

FIG. 4(c) shows the retimed signal at the output of the third OAND gate 116. The At output of the third OAND gate 116 is high only if both inputs are high. Thus, in FIG. 4(c) the output of the third OAND gate 16 starts low, goes high at time 402, goes low at time 412, goes high again at time 414 and returns low at time 416. While the retimed signal is not as wide as the clock signal, such a narrowing is acceptable since the signals spread out during transit.

Signal Retransmitting

After being reshaped and/or retimed, the optical signal is retransmitted by an optical amplifier 118. The optical amplifier 118 can be a erbium-doped fiber amplifier (EDFA), a Raman amplifier, a vertical lasing semiconductor optical amplifier (VLSOA), a transverse lasing SOA, a longitudinal lasing SOA, another lasing SOA in which the laser cavity is off-axis with respect to the amplifying path, or another type of optical amplifier. In some alternative embodiments, the first or third Optical one-input flip-flop 104 or 116 provides sufficient amplification that a separate optical amplifier 118 is not needed.

The VLSOA

Some embodiments of the OAND gates, variable oscillator, and the optical flip-flop all include VLSOAs. Although the described embodiments include VLSOAs, other devices can be used in other embodiments. For example, transverse lasing SOAs (in which the laser cavity is oriented transversely with respect to the amplifying path), other lasing SOAs in which the laser cavity is off-axis with respect to the amplifying path, or longitudinal lasing SOAs in which the laser cavity is aligned with respect to the amplifying path may all be used in place of some or all of the VLSOAs.

Figure 5:
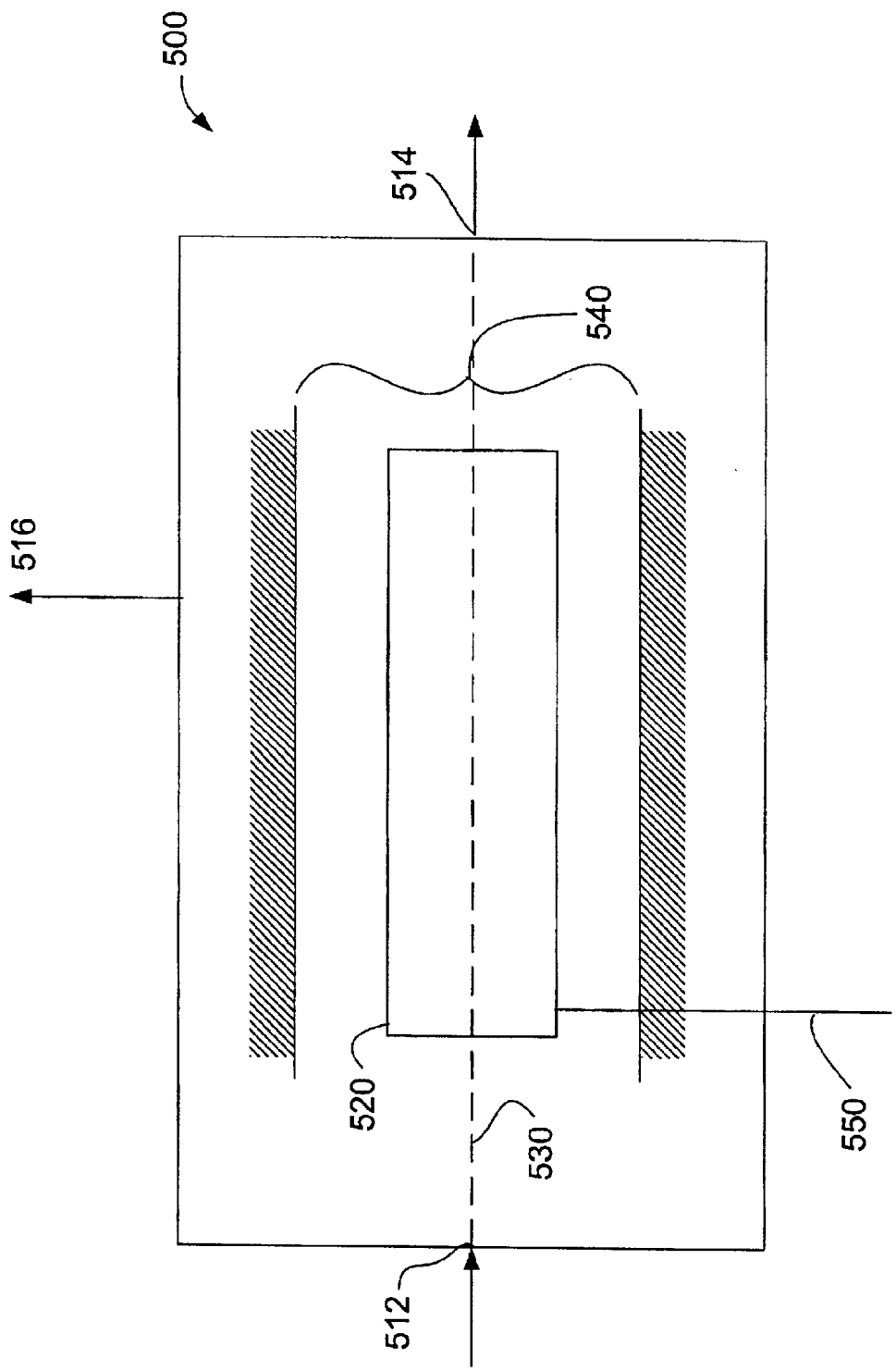
FIG. 5 is a diagram of a vertical lasing semiconductor optical amplifier (VLSOA) in accordance with the present invention.

FIG. 5 is a diagram of a VLSOA 500 in accordance with the present invention. The VLSOA 500 has an amplifier input 512 and an amplifier output 514. The VLSOA 500 further includes a semiconductor gain medium 520, with an amplifying path 530 coupled between the input 512 and the output 514 of the VLSOA 500 and traveling through the semiconductor gain medium 520. The VLSOA 500 further includes a laser cavity 540 including the semiconductor gain medium 520, and a pump input 550 coupled to the semiconductor gain medium 520. The laser cavity 540 is oriented vertically with respect to the amplifying path 530. The pump input 550 is for receiving a pump to pump the semiconductor gain medium 520 above a lasing threshold for the laser cavity 540. When pumped above threshold, the laser cavity 540 generates a laser signal, which will be referenced to as a ballast laser signal. The ballast laser signal exits the VLSOA 500 via ballast laser output 516.

Figure 6:
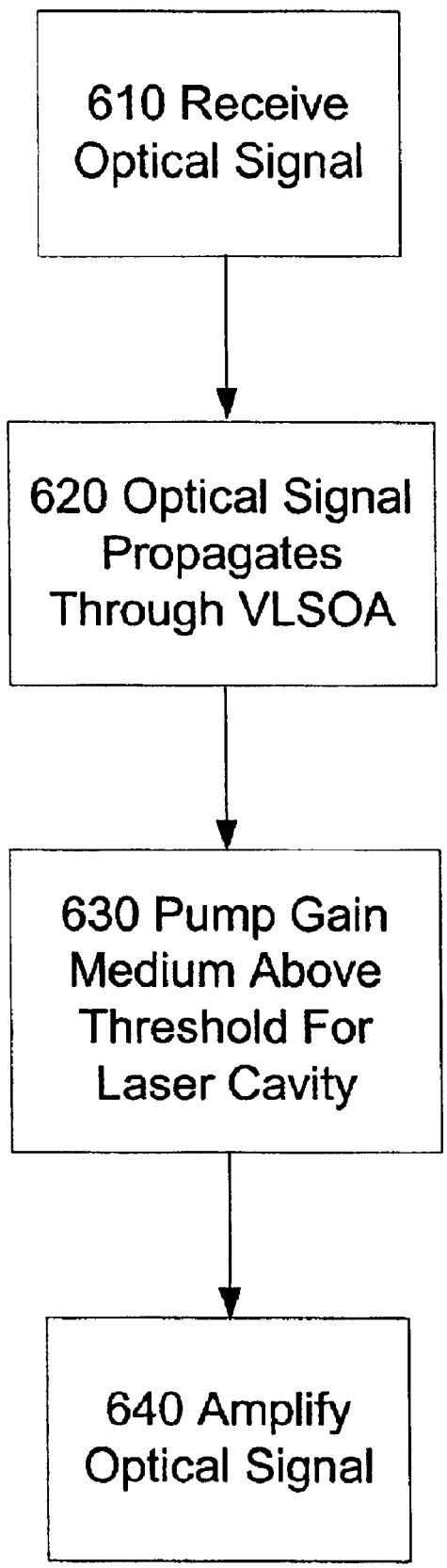
FIG. 6 is a flow diagram illustrating operation of VLSOA when it is used as an amplifier.

FIG. 6 is a flow diagram illustrating operation of VLSOA 500 when it is used as an amplifier. The VLSOA 500 receives 610 an optical signal at its amplifier input 512. The optical signal propagates 620 along the amplifying path 530. The pump received at pump input 550 pumps 630 the semiconductor gain medium above a lasing threshold for the laser cavity 540. When lasing occurs, the round-trip gain offsets the round-trip losses for the laser cavity 540. In other words, the gain of the semiconductor gain medium 520 is clamped to the gain value necessary to offset the round-trip losses. The optical signal is amplified 640 according to this gain value as it propagates along the amplifying path 530 (i.e., through the semiconductor gain medium 520). The amplified signal exits the VLSOA 500 via the amplifier output 514.

Note that the gain experienced by the optical signal as it propagates through the VLSOA 500 is determined in part by the gain value of the semiconductor gain medium 520 (it is also determined, for example, by the length of the amplifying path 530) and this gain value, in turn, is determined primarily by the lasing threshold for the laser cavity 540. In particular, the gain experienced by the optical signal as it propagates through each VLSOA 500 is substantially independent of the amplitude of the optical signal. This is in direct contrast to the situation with non-lasing SOAs and overcomes the distortion and crosstalk disadvantages typical of non-lasing SOAs.

Figure 7A:
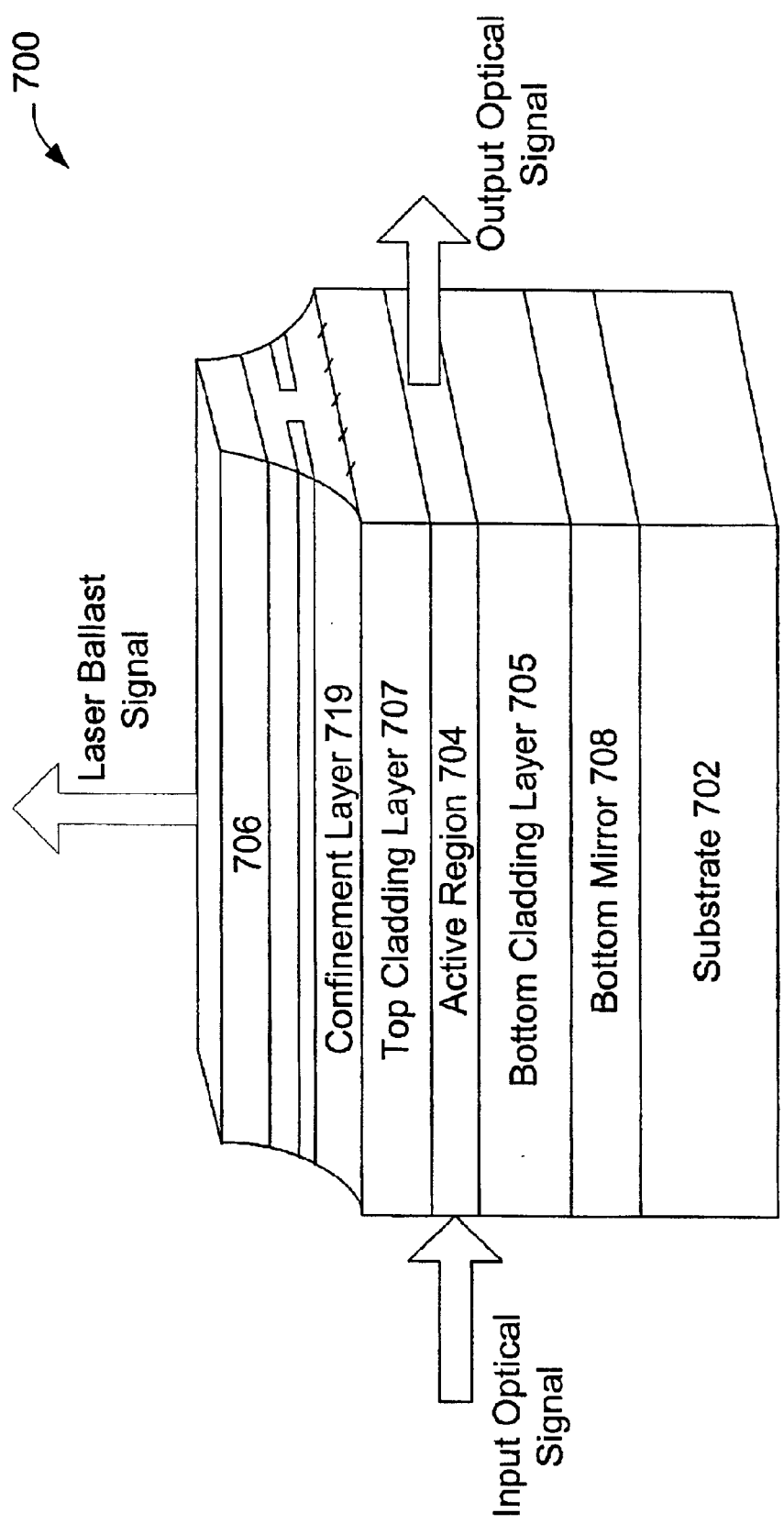
FIGS. 7(a)–7(c) are a perspective view, transverse cross-sectional view, and a longitudinal cross-sectional view of an embodiment of a VLSOA.
Figure 7B:
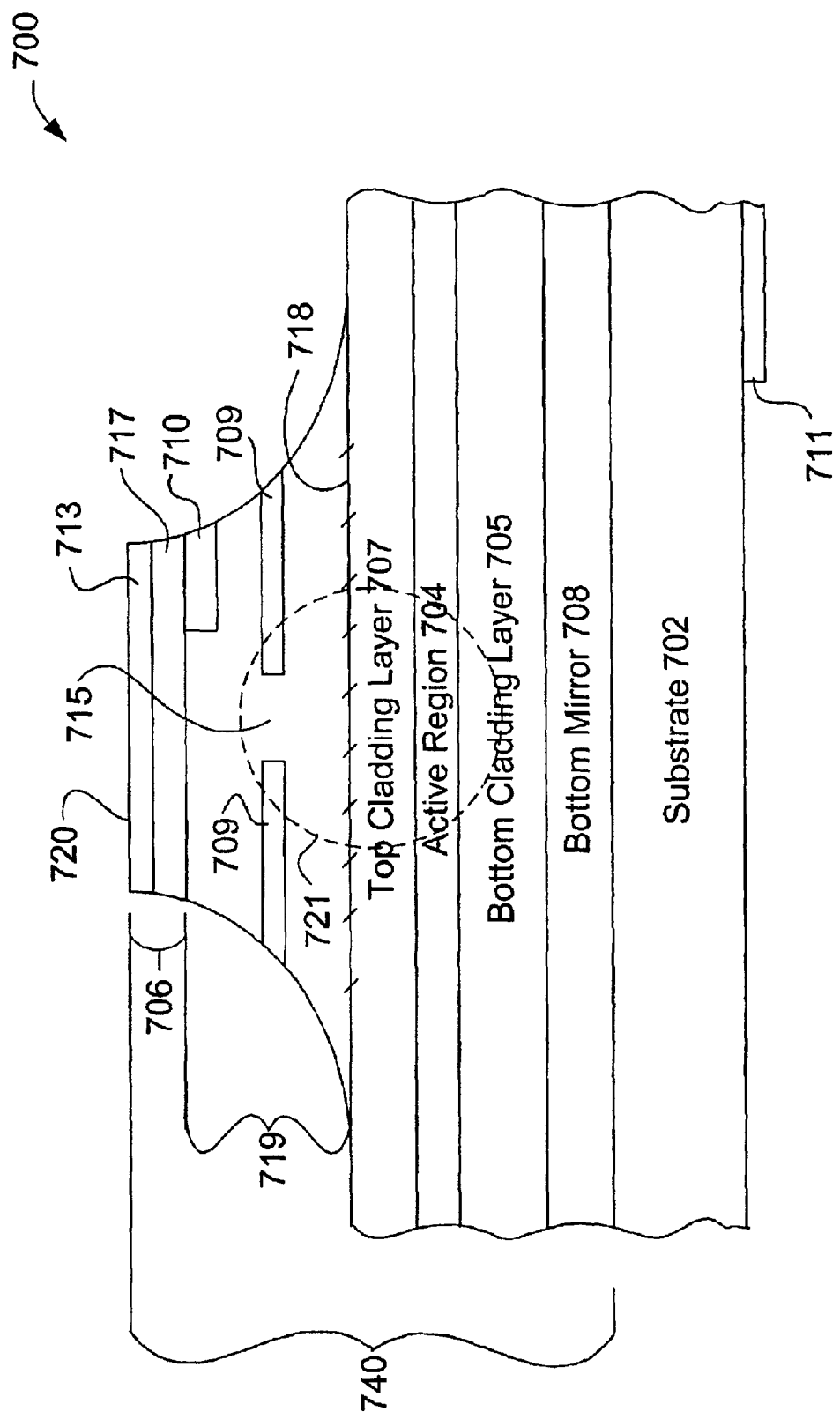
Figure 7C:
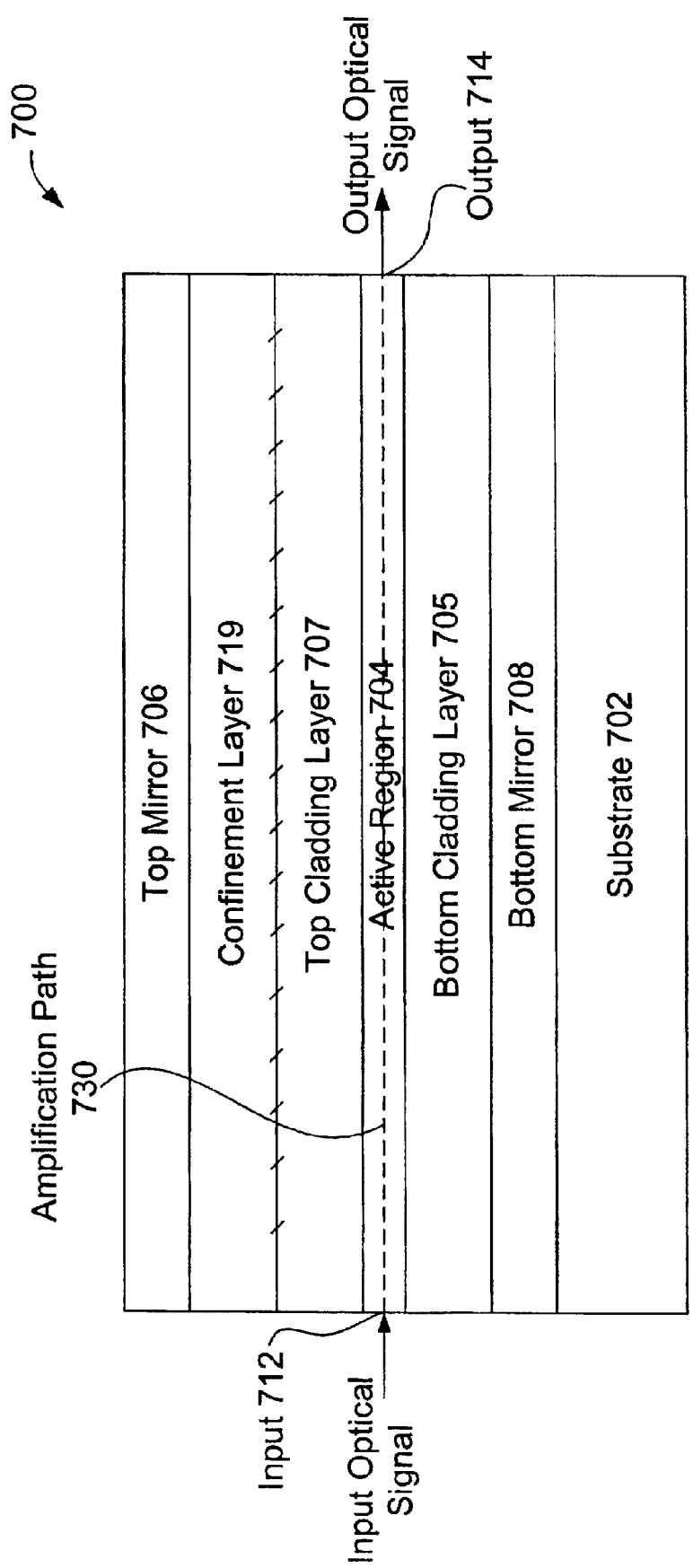

FIGS. 7(a)–7(c) are a perspective view, transverse cross-section, and longitudinal OX cross-section, respectively, of an embodiment of a VLSOA according to the present invention, with FIG. 7(b) showing the most detail.

Referring to FIG. 7(b) and working from bottom to top in the vertical direction (i.e., working away from the substrate 702), VLSOA 700 includes a bottom mirror 708, bottom cladding layer 705, active region 704, top cladding layer 707, confinement layer 719, and a top mirror 706. The bottom cladding layer 705, active region 704, top cladding layer 707, and confinement layer 719 are in electrical contact with each other and may be in direct physical contact as well. An optional delta doping layer 718 is located between the top cladding layer 707 and confinement layer 719. The confinement layer 719 includes a confinement structure 709, which forms aperture 715. The VLSOA 700 also includes an electrical contact 710 located above the confinement structure 709, and a second electrical contact 711 formed on the bottom side of substrate 702.

Comparing to FIG. 5, the semiconductor gain medium 520 includes the active region 704 and the laser cavity 540 is formed primarily by the two mirrors 706 an d 708 and the active region 704. This embodiment is electrically pumped so the pump input 550 includes the electrical contacts 710, 711. The ballast laser output 516 is located on a top surface of VLSAT 700.

VLSOA 700 is a vertical lasing semiconductor optical amplifier since the laser cavity 740 is a vertical laser cavity. That is, it is oriented vertically with respect to the amplifying path 730 and substrate 702. The VLSOA 700 preferably is long in the longitudinal direction, allowing for a long amplifying path 730 and, therefore, more amplification. The entire VLSOA 700 is an integral structure formed on a single substrate 702 and may be integrated with other optical elements. In most cases, optical elements which are coupled directly to VLSOA 700 will be coupled to the amplifying path 730 within the VLSOA. Depending on the manner of integration, the amplifier input 712 and output 714 may not exist as a distinct structure or facet but may simply be the boundary between the VLSOA 700 and other optical elements. Furthermore, although this disclosure discusses the VLSOA 700 primarily as a single device, the teachings herein apply equally to arrays of devices.

VLSOA 700 is a layered structure, allowing the VLSOA 700 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 700 is confined in the vertical direction by index differences between bottom cladding 705, active region 704, and top cladding 707, and to a lesser extent by index differences between the substrate 702, bottom mirror 708, confinement layer 719, and top mirror 706. Specifically, active region 704 has the higher index and therefore acts as a waveguide core with respect to cladding layers 705,707. The optical signal is confined in the transverse direction by index differences between the confinement structure 709 and the resulting aperture 715. Specifically, aperture 715 has a higher index of refraction than confinement structure 709. As a result, the mode of the optical signal to be amplified is generally concentrated in dashed region 721. The amplifying path 730 is through the active region 704 in the direction in/out of the plane of the paper with respect to FIG. 7(b).

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 700 is optimized for the 1.55 micron window.

In one embodiment, the active region 704 includes a multiple quantum well (MQW) active region. MQW structures include several quantum wells and quantum wells have the advantage of enabling the formation of lasers with relatively low threshold currents. In alternate embodiments, the active region 704 may instead be based on a single quantum well or a double-heterostructure active region. The active region 704 may be based on various materials systems, including for example IAlGaAs on InP substrates, MGaAs on GaAs, InGaAsP on Inp, GaInNAs on GaAs, InGaAs on ternary substrates, and GaAsSb on GaAs. Nitride material systems are also suitable. The materials for bottom and top cladding layers 705 and 707 will depend in part on the composition of active region 704.

Examples of top and bottom mirrors 706 and 708 include Bragg reflectors and non-Bragg reflectors such as metallic mirrors. Bottom mirror 708 in FIG. 7 is shown as a Bragg reflector. Top mirror 706 is depicted as a hybrid mirror, consisting of a Bragg reflector 717 followed by a metallic mirror 713. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 710, 711 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 710, 711 into the active region 704. In particular, contact 710 is a p-type contact to inject holes into active region 704, and contact 711 is an n-type contact to inject electrons into active region 704. Contact 710 is located above the semiconductor structure (i.e., above confinement layer 719 and the semiconductor part of Bragg reflector 717, if any) and below the dielectric part of Bragg reflector 717, if any. For simplicity, in FIG. 7, contact 710 is shown located between the confinement layer 719 and Bragg reflector 717, which would be the case if Bragg reflector 717 were entirely dielectric. VLSOA 700 may have a number of isolated electrical contacts 710 to allow for independent pumping within the amplifier. This is advantageous because VLSOA 700 is long in the longitudinal direction and independent pumping allows, for example, different voltages to be maintained at different points along the VLSOA. Alternately, the contacts 710 may be doped to have a finite resistance or may be separated by finite resistances, rather than electrically isolated.

Confinement structure 709 is formed by wet oxidizing the confinement layer 719. The confinement structure 709 has a lower index of refraction than aperture 715. Hence, the effective cross-sectional size of laser cavity 740 is determined in part by aperture 715. In other words, the confinement structure 709 provides lateral confinement of the optical mode of laser cavity 740. In this embodiment, the confinement structure 709 also has a lower conductivity than aperture 715. Thus, pump current injected through electrical contact 710 will be channeled through aperture 715, increasing the spatial overlap with optical signal 721. In other words, the confinement structure 709 also provides electrical confinement of the pump current.

FIG. 6 was used to illustrate operation of VLSOA 500 as an amplifier. However, the VLSOA 500 can also be used for purposes other than amplification, for example switching, inversion and wavelength conversion. Referring again to FIG. 5, the four basic input and output ports of VLSOA 500 are the amplifier input 512 to the amplifying path 530, the amplifier output 514 of the amplifying path 530, a pump input 550 for pumping the semiconductor gain medium 550, and a ballast laser output 516 for the laser mode of the laser cavity 540.

VLSOA Configured as Inverter

Figure 8:
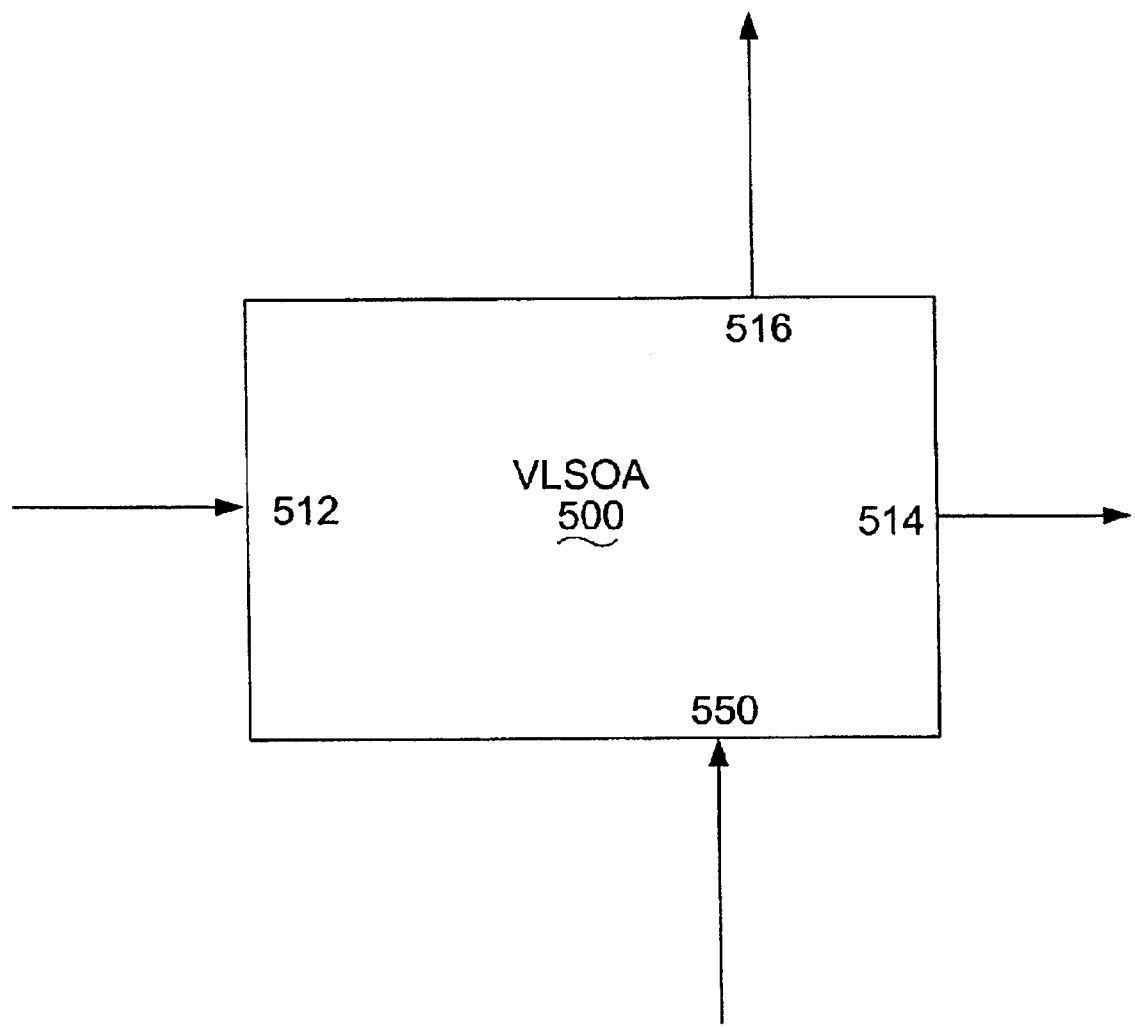
FIG. 8 is a block diagram of a VLSOA configured to function as an inverter.

In the OAND gates and some other applications, the VLSOAs are used as inverters. FIG. 8 is a block diagram of a VLSOA 500 configured to function as an inverter. In this application, the amplifier input 512 serves as the input to the inverter and the ballast laser output 516 serves as the output The pump input 550 acts as a power source. In general, the amplifier output 514 is discarded in this application. This configuration takes advantage of the fact that the laser output 516 acts as a ballast, as will be further described below. In other words, if the amplifier output 514 is strong, the laser output 516 will be weak. But if the amplifier output 514 is weak, the laser output 516 will be strong. Hence, if a digital "0", a weak or nonexistent signal, is input to the amplifier input 512, the resulting amplifier output 514 will still be relatively weak and the laser output 516 will be strong (a digital "1"). Conversely, if a digital "1", a strong signal, is input to the amplifier input 512, the resulting amplifier output 514 will also be strong and the laser output 516 will be weak (digital "0"). Taken to an extreme, if no signal is input to the VLSOA 500, there will be no amplifier output 514 and the laser output 516 will have its maximum strength. On the other hand, if a very strong signal is input to the VLSOA 500, the gain region will be depleted and lasing will be extinguished, resulting in no laser output 516. Hence, the VLSOA 500 operates as an inverter.

Optical Flip-Flop Detail

Figure 9:
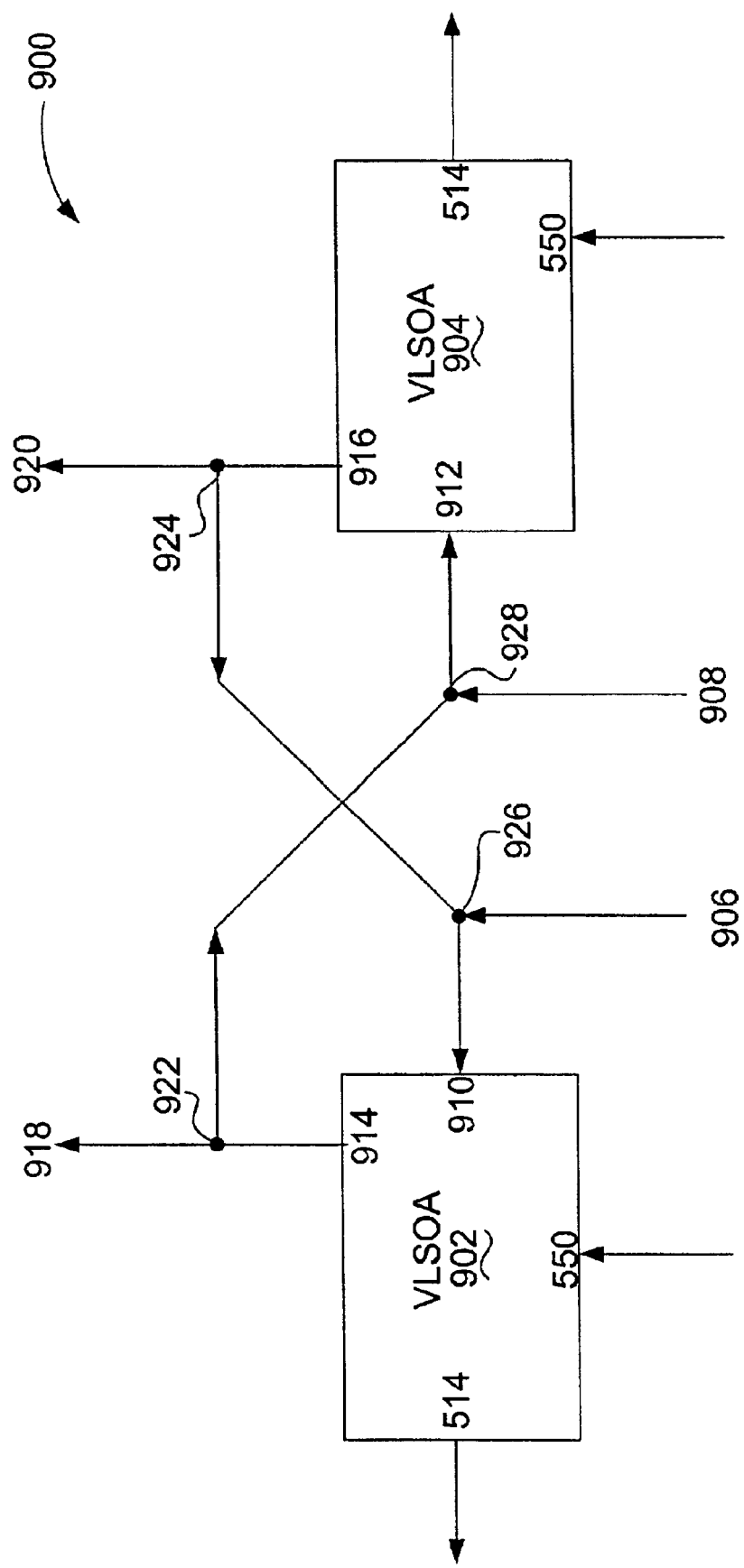
FIG. 9 is a block diagram of an optical flip-flop.

FIG. 9 is a diagram of an optical flip-flop 900. The flip-flop 900 has a set input 906, a reset input 908, a first output 918, and a complimentary second output 920. The flip-flop 900 includes a first VLSOA 902, a second VLSOA 904, two combiners 926 and 928, and two splitters 922 and 924. The first VLSOA 902 has a pump input 550, an amplifier input 910, an amplifier output 514 and a ballast laser output 914. Similarly, the second VLSOA 904 has a pump input 550, an amplifier input 912, an amplifier output 514 and a ballast laser output 916.

The components of the flip-flop 900 are coupled as follows. Combiner 926 receives two inputs, the set input 906 and an input received from the laser output 916 from the second VLSOA 904 via splitter 924. The output of combiner 926 is coupled to the amplifier input 910 of the first VLSOA 902. The laser output 914 of the first VLSOA 902 is coupled to splitter 922. One output of splitter 922 goes to the first output 918 and another output of splitter 922 goes to combiner 928. Combiner 928 receives the output from splitter 922 as well as the reset input 908. The output of combiner 928 is coupled to the input 912 of the second VLSOA 904. The laser output 916 of the second VLSOA 904 is coupled to splitter 924. One output of splitter 924 is coupled to combiner 926 and the other output goes to the second output 920. In general, the amplifier outputs 514 of the first and second VLSOAs 902 and 904 are discarded. The amplifier outputs 514 are used as amplified replicas of the first and second outputs 918 and 920, in some embodiments. In some embodiments, to aid in avoiding destructive interference at the combiner 926, the wavelengths or polarizations or both of the set input signal 906 and the laser output 916 from the second VLSOA 904 are different. Similarly, the wavelengths or polarizations or both of the reset input signal 908 and the laser output 914 from the first VLSOA 902 are different in some embodiments, to aid in avoiding destructive interference at the combiner 928. This is done in one embodiment by using VLSOAs having laser outputs with different wavelengths.

The optical flip-flop 900 operates as follows. VLSOAs 902 and 904 operate primarily as inverters. If reset input 908 and set input 906 are both low, then the device is bistable and "remembers" its last state. If the set input 906 is asserted high with the reset input 908 low, then the device is set to a state with the second output 920 high and the first output 918 low. Conversely, if the reset input 908 is asserted high with the set input 906 low, the device is reset to a state where the second output 920 is low and the first output 918 is high.

The optical flip-flop 900 implements this functionality as follows. First consider the first VLSOA 902 of flip-flop 900. VLSOA 902 is designed so that either a strong set input 906 signal or a strong second output 920 signal (received via splitter 924 and combiner 926) is sufficient to result in an amplifier output 514 which is strong enough to deplete the laser ballast, resulting in a weak first output 918 signal at laser output 914. In other words, if the set input 906 is strong (digital "1"), then the amplifier output 514 will be strong and the laser output 914 will be weak (i.e., the first output 918 will be a digital "0"). Similarly, if the second output 920 is strong (digital "1"), then the amplifier output 514 will be strong and the laser output 914 will be weak (i.e., the first output 918 will be a digital "0").

Therefore, the combiner 926 and VLSOA 902 together implement a digital NOR gate, with the set input 906 and the second output 920 as the inputs and the first output 918 as the output of the NOR gate. VLSOA 904 together with combiner 928 operate similarly and implement a second NOR gate, with the reset input 908 and the first output 922 as the inputs and the second output 920 as the output of the NOR gate. Thus, optical flip-flop 900 consists of two cross-coupled NOR gates. The optical flip-flop may also be implemented with optical NAND gates in other embodiments.

The optical flip-flop 900 has two stable states. The first stable state occurs if the reset input 908 is low, and a high signal is input at the set input 906. In the first stable state, the first output 918 is low and the second output 920 is high. This occurs because the high set input 906 input causes the laser output 914 of the first VLSOA 902 to be weak, which in turn means that the first output 918 is weak, and only weak signals (digital "0's") are received at combiner 928. Since only weak signals are input to the second VLSOA 904, the laser output 916 of the second VLSOA 904 is high. This high signal is then sent to the input 910 of the first VLSOA 902 via the splitter 924 and the combiner 926. Thus, since the high signal from the second VLSOA 904 is then being input to the first VLSOA 902, the optical flip-flop 900 remains in the first stable state if the high signal at the set input 906 input is subsequently removed. The second stable state is similar to the first. However, in the second stable state, a high signal is input to the reset input 908 while the set input 906 is low. In the second stable state, the first output 918 is high and the second output 920 is low.

OAND Gate Detail

Figure 10:
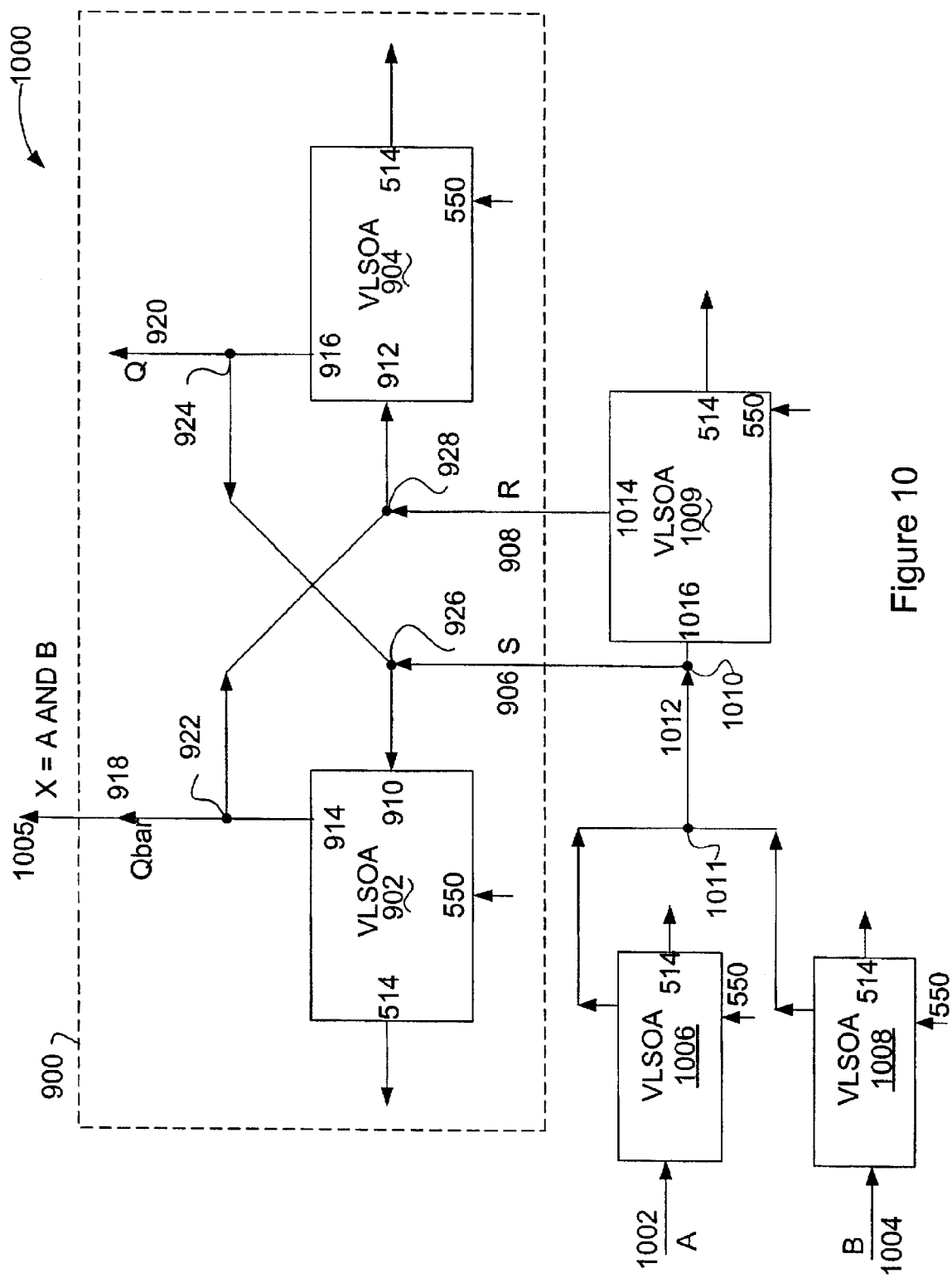
FIG. 10 is a block diagram of an optical AND gate.

FIG. 10 is a block diagram of an optical AND gate 1000. An optical AND gate in 1000 is similar to an electronic AND gate, but operates with optical signals, instead of electrical signals. The input signals enter the optical AND gate 1000 on two inputs 1002 and 1004. The output 1005 then outputs a signal that varies based on the values of the input signals. If both of the signals on the inputs 1002 and 1004 are high, then the signal on the output 1005 is high. If either or both of the signals on the inputs 1002 and 1004 are low, the signal on the output 1005 is low.

The optical AND gate 1000 includes the optical flip-flop 900 described above with respect to FIG. 9. In addition to the optical flip-flop 900, the optical AND gate 1000 comprises an optical NAND gate, a first input 1002, a second input 1004, an input splitter 1010, and a third VLSOA 1009. Qbar 918 of the optical flip-flop 900 is used as the output 1005 of the optical AND gate 1000.

The optical NAND gate comprises two VLSOAs 1006 and 1008. The two AND gate inputs 1002 and 1004 also serve as the two NAND gate inputs and are connected to the amplifier inputs 512 of the two VISOAs 1006 and 1008, respectively. The laser outputs 516 of the two VLSOAs 1006 and 1008 are combined at a combiner 101 to result in a combined signal 1012. The pump inputs 550 of the VLSOAs 1006 and 1008 act as power sources. The amplifier outputs 514 of the two VLSOAs 1006 and 1008 are generally discarded in the optical NAND gate. In some embodiments, to aid in avoiding destructive interference between combined signals, the wavelengths or polarizations or both of the combined signals are selected to be different. This is done in some embodiment by using VLSOAs having laser outputs with different wavelengths.

The optical NAND gate takes advantage of the fact that, in the VLSOAs 1006 and 11008, the ballast laser signals on the laser outputs 516 act as ballast. If a weak signal (a digital "0") is input to one of the amplifier inputs 512, the semiconductor gain medium 520 will not be near depleted by the optical signal on the amplifying path 530 (i.e., it will be well below the depletion threshold) and the ballast laser signal on 516 will be strong (a digital "1"). Conversely, if a strong signal (digital "1") is input to one of the amplifier inputs 512, the semiconductor gain medium 520 will be near or beyond depletion and the ballast laser signal on 516 will be weak or extinguished (digital "0"). The strong signal of either of the VLSOAs 1006 and 1008 is a strong signal (digital "1") at the output 1012. Thus, if either or both of the VLSOAs output a strong signal from one of the laser outputs 516, the output 1012 of the optical NAND gate is strong. Only if both of the laser outputs 516 of the two VLSOAs 1006 and 1008 are weak will the output 1012 be weak. This occurs when both of the inputs 1006 and 1008 are strong. Thus, NAND functionality is implemented. As noted above, the optical flip-flop 900 may be implemented with optical NAND gates.

Two embodiments of and optical AND gate 1000 are described. The first embodiment of an optical AND gate 1000 is simpler than the second embodiment. The first embodiment comprises the NAND gate described above in combination with another VLSOA that acts as an inverter as described above. In the first embodiment, the NAND gate output 1012 is simply used as the input to the inverter. Thus, the inverter inverts the NAND gate output 1012 and the resulting combination is an optical AND gate.

FIG. 10 is a block diagram of the second embodiment of an optical AND gate 1100. The components of the optical AND gate 1000 are coupled as follows. Both the first input 1002 and the second input 1004 are coupled to the optical NAND gate. The output 1012 of the NAND gate is coupled to the input splitter 1010. One output of the input splitter 1010 is coupled to the S input 906 of the optical flip-flop 900. The other output of the input splitter 1010 is coupled to the amplifier input 1016 of the third VLSOA 1009. The ballast laser output 1014 of the third VLSOA 1009 is coupled to the R input 908 of the optical flip-flop 900. In general, the amplifier output 514 of the third VLSOA 1009 is discarded.

The optical AND gate 1000 functions as follows. The input signals received at the first and second inputs 1002 and 1004 are received at the NAND gate. The output 1012 of the NAND gate is sent to the input splitter 1010. Part of the split signal from the input splitter 1010 is sent to the S input 906 of the optical flip-flop 900. Part of the split signal from the input splitter 1010 is also sent from the input splitter 1010 to the amplifier input 1016 of the third VLSOA 1009. The ballast laser output 1014 of the third VLSOA 1009 is coupled to the R input 908 of the optical flip-flop 900. Since the ballast laser output 1014 of the third VLSOA 1009 is used, the third VLSOA 1009 functions as an inverter, as described above. Because the third VLSOA 1009 functions as an inverter, the signal received at the R input 908 of the optical flip-flop 900 is the opposite of the signal received at the S input 906 of the optical flip-flop 900. Therefore, a high signal is input to either the S input 906 or the R input 908, and a low signal to the other input 906 or 908.

If the output 1012 of the NAND gate is high, the S input 906 to the optical flip-flop 900 is high and the R input 908 to the optical flip-flop 900 is low. Therefore, Qbar 918, used as the output to the optical AND gate 1000, is low and Q 920 is high. Thus, if either input 1002 or 1004 is low, the output 1012 of the NAND gate is high, and the optical AND gate 1000 output 1005 is low. If both the inputs 1002 and 1004 are high, the output 1012 of the NAND gate is low, and therefore Qbar, and the AND gate output 1005, is high.

Thus, the optical AND gate 1000 has an output 1005 of high (digital "1") if both the inputs 1002 and 1004 are high. The optical AND gate 1000 has an output 1005 of low (digital "0") if either or both of the inputs 1002 and 1004 are low.

In addition, if Q 920 is used as the output, the optical AND gate 1000 functions as another embodiment of an optical NAND gate. This is because Q 920 provides the opposite signal that Qbar 918 does.

One-Input Optical Flip-Flop

The optical 2R/3R regenerator also includes a one-input optical flip-flop. A two-input optical flip-flop 900 was discussed above, with respect to FIG. 9. A one-input optical flip-flop is similar to the optical AND gate 1000 of FIG. 10, and includes most of the components of the optical AND gate 1000. However, in contrast to the optical AND gate 1000, VLSOAs 1006 and 1008 are not included in the one-input optical flip-flop. The one-input optical flip-flop has one input 1002, and does not use the second input 1004. This one input 1002 is connected to the splitter 1010.

The one-input optical flip-flop functions as follows. The input signal is received at the first input 1002. The input 1002 is sent to the input splitter 1010, and then to the set input 906 of the optical flip-flop 900. The input 1002 is also sent from the input splitter 1010 to the amplifier input 1016 of the third VLSOA 1009. The laser output 1014 of the third VLSOA 1009 is coupled to the reset input 908 of the optical flip-flop 900. Since the laser output 1014 of the third VLSOA 1009 is used, the third VLSOA 1009 functions as an inverter, as described above. Because the third VLSOA 1009 functions as an inverter, the signal received at the reset input 908 of the optical flip-flop 900 is the opposite of the signal received at the set input 906 of the optical flip-flop 900. Therefore, a high signal is input to either the set input 906 or the reset input 908.

If the input 1002 is high, the set input 906 to the optical flip-flop 900 is high and the reset input 908 to the optical flip-flop 900 is low. A high input is an input over the depletion threshold of the VLSOA. Therefore, the first output 918 is low and the second output 920, used as the output of the one-input optical flip-flop, is high. Thus, if the input 1002 is high, the one-input optical flip-flop output 920 is high also. The depletion thresholds of the VLSOAs 902, 904, and 1009 of the one-input optical flip-flop are chosen so that if the input 1002 is high, the laser outputs of VLSOAs 1009 and 902 are low. If the input 1002 is low, the laser outputs of VLSOAs 1009 and 902 remain high enough so that the laser output 916 of the VLSOA 904, and therefore the second output 920, which is the output of the one-input optical flip-flop, is low.

Thus, the one-input optical flip-flop has an output 920 of high (digital "1") if the input 1002 is high. The one-input optical flip-flop has an output 920 of low (digital "0") if the input 1002 is low.

As described above, the depletion threshold of VLSOAs 500, such as VLSOAs 902 and 1009, may be set in a number of different ways. For example, varying the gain of a VLSOA 500 will vary the depletion threshold. A higher gain means that depletion will be achieved by a weaker signal at the amplifier input 512, since the weaker signal at the amplifier input 512 will be amplified more while propagating through the VLSOA 500. In other words, increasing the gain of the VLSOA 500 reduces the depletion threshold. As another example, the amount of laser ballast itself may be varied by varying how much the VLSOA 500 is pumped. Pumping the VLSOA 500 harder results in a stronger laser ballast, which in turn will require more depletion before toggling. Thus, pumping harder increases the depletion threshold. Furthermore, by varying the splitter or combiner ratios of splitters 922 and 924 or combiners 926 and 928, or by adding additional loss in the connecting branches in the circuit, the thresholds can be adjusted.

Variable Oscillator

Figure 11:
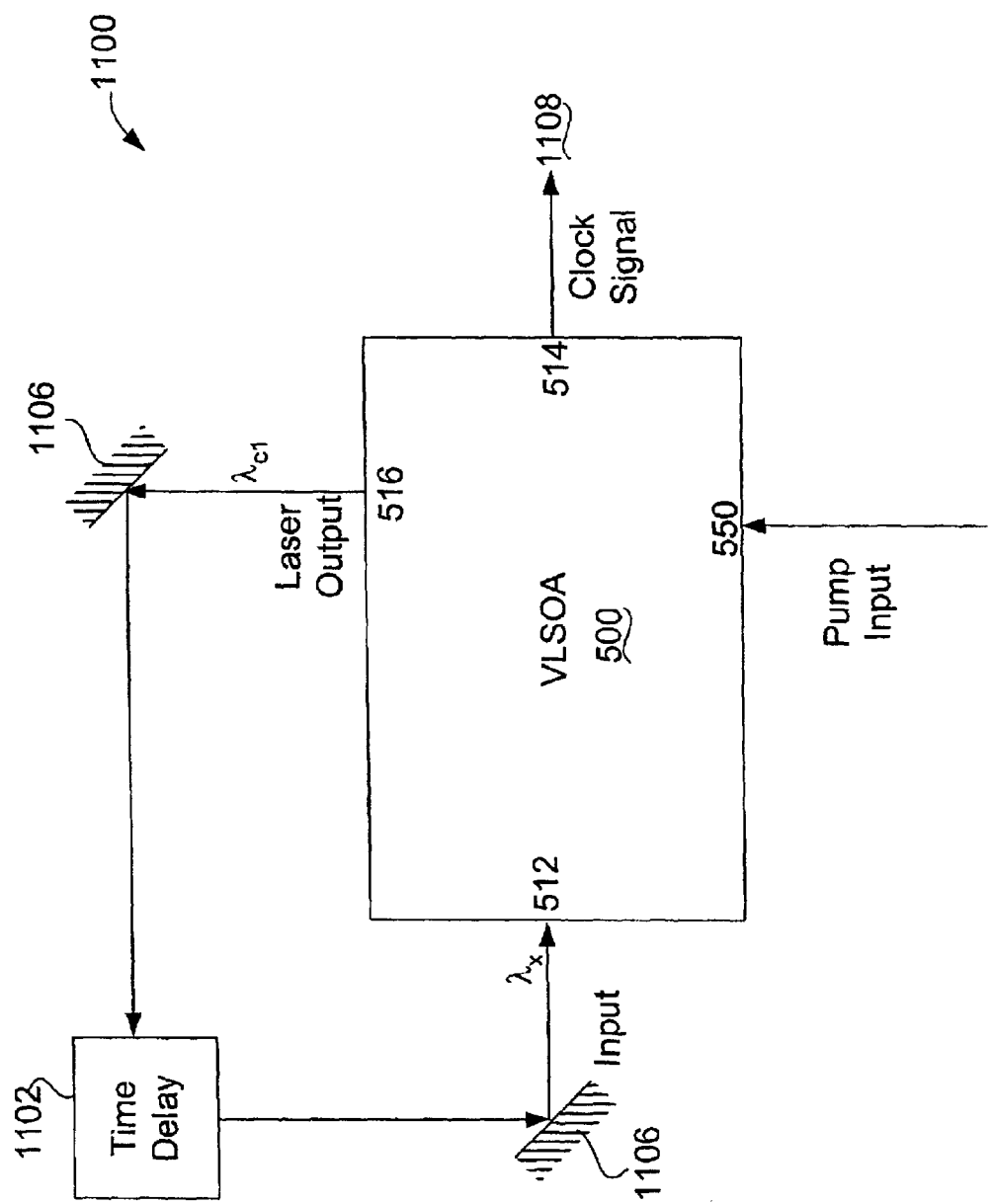
FIG. 11 is a block diagram of an optical astable multivibrator.

In some embodiments, the variable oscillator 114 is a tunable optical astable multivibrator. FIG. 11 is a block diagram of an optical astable multivibrator 1100 which includes a VLSOA 500. When used as part of an astable multivibrator 1100 as shown in FIG. 11, the laser output 516 of the VLSOA 500 is coupled to a time delay 1102. The laser output 516 is directed to the time delay 1102 by mirrors 1106, by waveguides, or by other methods or devices. The output of the time delay 1102 is then coupled to the input 512 of the VLSOA 500, again by using mirrors 1106, by using waveguides, or using other methods or devices. The time delay 1102 creates a time lag between the time a signal leaves the laser output 516 of the VLSOA 500 and the time the signal reenters the VLSOA 500 as the input 512. The amplifier output 514 of the VLSOA 500 is the output signal 1108 of the astable multivibrator 1100.

As discussed above, the VLSOA 500 can operate as an inverter. The laser output 516 of the VLSOA 500 is the input 512 signal inverted. In the astable multivibrator 1100, the laser output 516 of the VLSOA 500 is returned to the input 512 after passing through the time delay 1102. Thus, since the laser output 516 is the input 512 signal inverted, and the time-delayed laser output 516 is also fed back into the VLSOA 500 input 512, the result is a periodic square waveform at the amplifier output 514 of the VLSOA 500. This amplifier output 514 is used as the output 1108 of the astable multivibrator 1100.

The time delay 1102 determines the frequency of the periodic square waveform at the output 1108 of the astable multivibrator 1100. Varying the time delay 1102 varies the frequency of the periodic square waveform. Thus, an astable multivibrator can function as the variable oscillator 114. Advantageously, the astable multivibrator 1100 illustrated in FIG. 1 is capable of generating a waveform with a much higher frequency than electronic systems generate. In one embodiment, the time delay 1102 is provided by a length of optical fiber. The length of the optical fiber determines the amount of delay. A longer optical fiber means a longer delay and a smaller frequency of the output 514. In an alternate embodiment, the time delay 1102 is a silicon waveguide. Again, a longer silicon waveguide means a longer delay and lower frequency. For example, routing the laser output 516 through 1 mm of silicon as the time delay 1102 prior to the input 512 provides a waveform at the output 1108 of the astable multivibrator 1100 of 100–160 Gigahertz.

The frequency of the signal at the output 108 of the astable multivibrator 1100 can also be varied by changing the wavelength of the laser output 516 of the VLSOA 500. In changing the wavelength of the laser output 516, the time delay also changes, due to dispersion, as the laser travels through the time delay 1102 material. Dispersion, the change in propagation velocity with wavelength, can be intrinsic to the material used in the time delay element 1102. Also, the dispersion in the time delay 1102 can be enhanced by using doped material, a Gires-Turnois interferometer, the dispersive properties of a resonator cavity or element (Fabry-Perot or otherwise), Bragg grating structures, couplers, grating assisted couplers, or dispersive or normal waveguides. The wavelength of the laser output 516 is determined by the optical path length of the laser cavity of the VLSOA 500. Two aspects of the VLSOA 500 primarily determine the optical path length, and thus the wavelength of the laser output 516: the distance between the mirrors of the VLSOA 500 and the refractive index of the active materials of the VLSOA 500. By choosing the distance between the mirrors and the refractive index of the active materials, the wavelength of the laser output 516 can be varied, which in turn determines the frequency of the output 514 signal.

Figure 12:
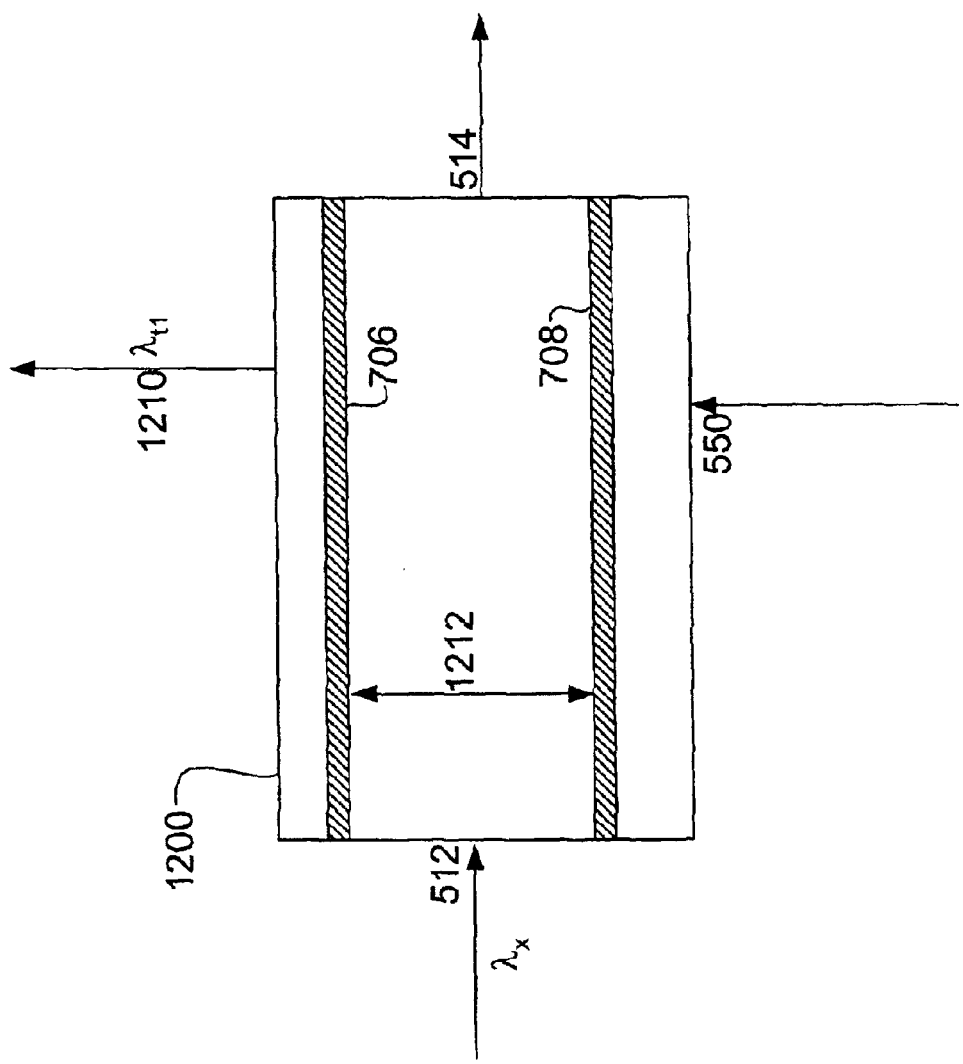
FIG. 12 is a diagram of an embodiment of a tunable VLSOA, used in a tunable astable multivibrator.

FIG. 12 is a diagram of an embodiment of a tunable VLSOA 1200, having a tunable laser output 1210 wavelength, used in a tunable astable multivibrator 1100. The VLSOA 1200 has an input 512 to the amplifying path, an amplifier output 514, a pump input 550 for pumping the active region, and a ballast laser output 1210 for the laser mode of the laser cavity. The optical path length of the VLSOA 1200 is tunable. Thus, because the optical path length of the laser cavity determines the wavelength $\lambda_{t1}$ of the laser output 1210, the laser output 1210 of the VLSOA 1200 has a tunable wavelength $\lambda_{t1}$.

The optical path length of the lasing cavity determines the wavelength $\lambda_{t1}$. Two aspects of the tunable VLSOA 1200 primarily determine the optical path length, and thus the wavelength $\lambda_{t1}$, of the laser output 1210: the distance 1212 between the mirrors 706 and 708 and the refractive index of the active materials of the tunable VLSOA 1200. In the tunable VLSOA 1200, the distance 1212 between the mirrors 706 and 708, the refractive index, of both the distance 1212 and the refractive index, are variable. The optical path length can be changed physically, electro-optically, photo-optically, thermo-optically, through carrier injection, and by other methods.

Methods to tune the wavelength 24, of the VLSOA 1200 include: (a) ring cavities where the length of the ring determines the wavelength; (b) coupled cavity resonators, where a series of Fabry-Perot cavities, or rings, or another resonant cavity collectively determine the wavelength $\lambda_{t1}$; (c) photonic band gap resonators and filters—a group of resonators and filters that are very small and filter photons much in the same way electrons in a crystal form bandgaps; (d) directional coupler filters, which allow two modes to be coupled in a wavelength dependent manner using waveguide guide modes or another type of mode; (e) grating assisted couplers, which are similar to directional coupler filters, but a grating (periodic index or gain/absorption perturbations) is used to help select the peak wavelength; (f diffraction gratings, which cause a periodic change in index of refraction or gain/absorption across the transerse profile of the light beam such that wavelength dependent diffraction peaks ($1^{st}$ order, $2^{nd}$ order, etc.) result; (g) Echelle gratings, or one of many other types of gratings; (h) arrayed waveguide gratings, which are a series of waveguides that are phased to give wavelength dependent transmission, such as a phased array radar antenna system; (i) multi-mode interferometer filters, which utilize higher order transverse modes and their coupling between each other to achieve filter and splitter effects; (j) an asymmetric Mach-Zhender filter, which is a type of filter that utilizes a splitter, two unequal optical path lengths, and a combiner to achieve a filtered response (this can also be done using two polarizations); (k) Sagnac interferometer filter, which is similar to the Mach-Zhender but in a ring type configuration.

Figure 13A:
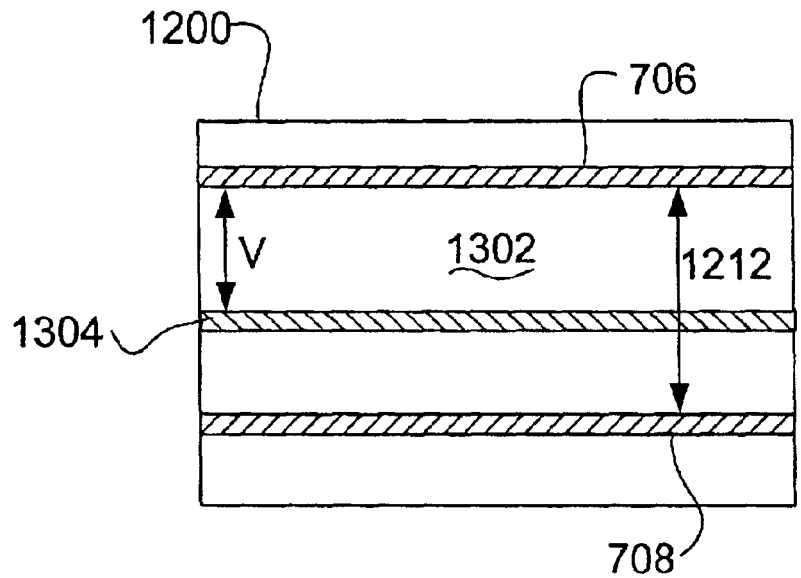
FIG. 13(a) is a diagram of a tunable VLSOA with a variable distance between the top and bottom mirrors.
Figure 13B:
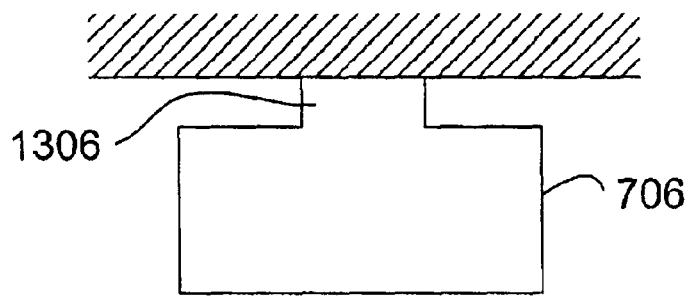
FIG. 13(b) is a diagram of one embodiment of a tunable VLSOA with a variable distance between the top and bottom mirrors.
Figure 13C:
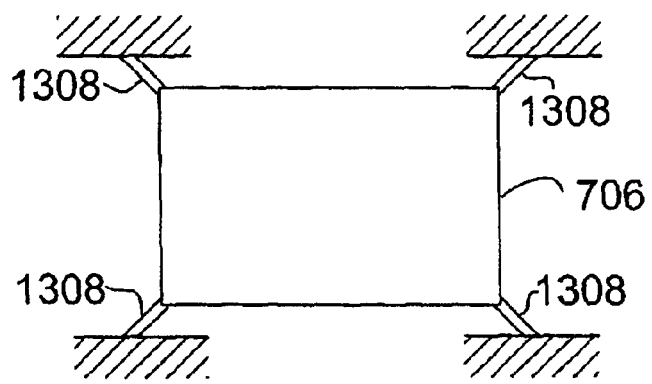
FIG. 13(c) is a diagram of one embodiment of a tunable VLSOA with a variable distance between the top and bottom mirrors.

FIG. 13($a$) is a diagram of a tunable VLSOA 1200 with a variable distance 1212 between mirrors 706 and 708. Changing the distance 1212 between the mirrors 706 and 708 changes the optical path length, and thus the wavelength of the laser output 1210. There are several ways to change the distance 1212 between the mirrors 706 and 708.

A first embodiment of a tunable VLSOA 1200 with a variable distance 1212 between the mirrors 706 and 708 uses a micro electro-mechanical system (MEMS) to adjust the distance 1212. The tunable VLSOA 1200 includes an air gap 1302 between the top mirror 706 and the bottom mirror 708. The top mirror 706 is capable of moving closer or further from the bottom mirror 708. In one embodiment, the range of motion of the top mirror 706 is approximately 30 nm. A voltage V is applied between the top mirror 706 and a conducting layer 1304 to move the top mirror 706. As the voltage V is changed, the top mirror 706 moves and the distance between the mirrors 706 and 708 changes. In this embodiment, the top mirror 706 is an electrostatic deformable membrane. Preferably, as the top mirror 706 moves, it remains parallel in to the active region of the tunable VLSOA 1200.

There are many arrangements of the top mirror 706 that allow the top mirror 706 to move. In one embodiment, shown in FIG. 13(b), the top mirror 706 is suspended in the air gap 1302 by a cantilever section 1306. In another embodiment, shown in FIG. 13(c), the top mirror 706 is suspended by four flexible tethers 1308. Alternatively, a different number of tethers 1308 could be used.

Figure 14:
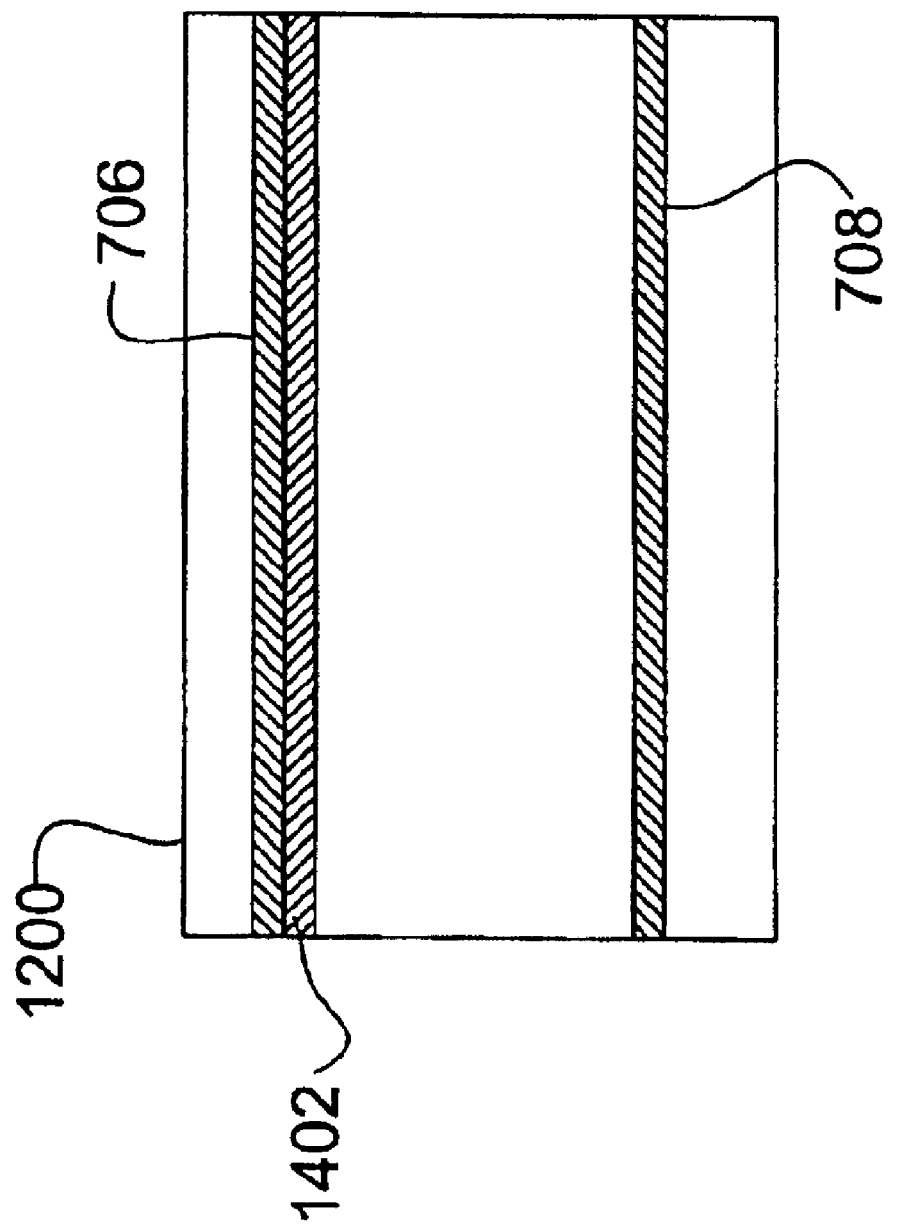
FIG. 14 is a diagram of an embodiment of a tunable VLSOA with a tunable laser output wavelength

The refractive index can also be changed to change the optical path length. There are several ways to change the refractive index. FIG. 14 is a diagram of an embodiment of a tunable VLSOA 1200 with a tunable laser output wavelength. The embodiment of the tunable VLSOA 1200 shown in FIG. 14 includes a tunable region 1402 between the active region and the top mirror 706. The tunable region 1402 could also be placed between the active region and the bottom mirror 708. The wavelength of the laser output is tuned by changing the refractive index of the tunable region 1402.

In a first embodiment, the tunable region 1402 is a liquid crystal layer. Applying a voltage across the liquid crystal layer controllably changes the refractive index. In another embodiment, layers of temperature sensitive materials are used to make up the tunable region 1402. Changing the temperature changes the refractive index of the layers of temperature sensitive materials.

Additionally, the index of refraction of the tunable region 1402 may be adjusted using physical mechanisms which occur within semiconductor material such as, for example, the thermo-optic effect, the Stark effect, the quantum-confined Stark effect, the Fin-Keldysh effect, the Burstein-Moss effect (band filling), the electro-optic effect, the acousto-optic effect, or other techniques. Further, electrons and/or holes can be injected into the tunable region to cause change in the refractive index.

Thus, it is possible to control the wavelength of the signal at the laser output 516. Since a different wavelength of the laser output results in a different time delay, the frequency of the output 514 is also controlled by controlling the wavelength of the laser output. A VLSOA with a tunable laser output wavelength provides an astable multivibrator 1100 with a controllable output 514 frequency.

In an alternative embodiment, the output 514 frequency is controlled by changing the index of refraction of the material providing the time delay. Changing the index of refraction of the time delay material changes the time delay provided by the time delay material. The index of refraction of the material providing the time delay can be changed using the same methods described above to change the index of refraction of the tunable region 1402.

Thus, the astable multivibrator 1100 is capable of providing a square waveform output over a range of frequencies. Such a square wave output allows the astable multivibrator to be used as the variable oscillator 114 of the 3R regenerator.

It should be noted that the VLSOA or other types of lasing SOAs can improve the performance of other types of 2R/3R regenerators (beyond the embodiments disclosed herein), wavelength converters, modelocked lasers, CW (continuous wave) ring lasers, and other systems that utilize conventional SOAs. By providing a constant gain for a significant range of input and output powers, the VLSOA or other type of lasing SOA improves extinction ratio or noise performance of such devices. If gain recovery is required, then the VLSOA or other lasing SOA provides for a much improved gain recovery time. Thus, for example, replacing conventional SOAs with lasing SOAs provides performance advantages.

While the invention has been particularly shown and described with reference to a preferred embodiment and several alternate embodiments, it will be understood by persons skilled in the relevant art that various changes in form and details can be made therein without departing from the spirit and scope of the invention.

What is claimed is:

1. An apparatus for reshaping an optical signal, comprising:
    a first input for receiving an input optical signal;
    an optical reshaper, comprising:
        a first lasing semiconductor optical amplifier (LSOA) having an optical reshaper input for receiving the input optical signal and a laser output for outputting a laser output optical signal in response to the input optical signal; and
        a second LSOA having an input connected to the laser output of the first LSOA, the second LSOA providing a laser output optical signal in response to the laser output signal of the first LSOA;
    a first output for outputting the output optical signal from the second LSOA; and
    where the output optical signal provided at the first output is the input optical signal reshaped.

2. The circuit of claim 1, the first LSOA further comprising a laser cavity.

3. The circuit of claim 2, the first LSOA further comprising an amplifying path connected to the LSOA input and passing through the laser cavity for propagating the input optical signal.

4. The circuit of claim 2, the first LSOA further comprising a pump input connected to the laser cavity for receiving a pump exceeding a lasing threshold for the laser cavity.

5. The apparatus of claim 1, wherein the first LSOA is a vertical lasing semiconductor optical amplifier (VLSOA).

6. The apparatus of claim 1, wherein the first LSOA is a transverse lasing semiconductor optical amplifier (TLSOA).

7. The apparatus of claim 1, wherein the first LSOA is a longitudinal lasing semiconductor optical amplifier (LLSOA).

8. An optical reshaper for reshaping an input optical signal, comprising:
    a first input for receiving the input optical signal;
    an optical reshaper output for outputting an optical reshaper output signal;
    a first lasing semiconductor optical amplifier (LSOA), comprising:
        an input for receiving optical signals and connected to the first input; and
        a laser output for outputting a first laser output optical signal in response to the received optical signals;
    a second LSOA, comprising:
        an input for receiving optical signals and connected to the first input; and a laser output for outputting a second laser output optical signal in response to the received optical signals;

a third LSOA, comprising:
an input for receiving optical signals and connected to the laser output of the first LSOA and to the laser output of the second LSOA; and
a laser output connected to the optical reshaper output and to the input of the second LSOA for outputting a third laser output optical signal in response to the received optical signals; and where the optical reshaper output signal is a reshaped input optical signal.

9. The optical reshaper of claim 8, wherein:
the optical reshaper output signal is low when the input optical signal is below a depletion threshold for the first LSOA; and
the optical reshaper output signal is high when the input optical signal is above a depletion threshold for the first LSOA.

10. The optical reshaper of claim 8, further comprising:
a second input for receiving a bias optical signal; and
a first combiner connected to the first input, the second input, the input of the first LSOA, and the input of the second LSOA for receiving the input optical signal and the bias optical signal, combining the input optical signal and the bias optical signal, and outputting the combined signal to the first LSOA and the second LSOA.

11. The optical reshaper of claim 10, wherein:
the optical reshaper output signal is low when the combined signal received a the first LSOA is below a depletion threshold for the first LSOA; and
the optical reshaper output signal is high when the combined signal received at the first LSOA is above a depletion threshold for the first LSOA.

12. The optical reshaper of claim 8, wherein the first LSOA further comprises:
a laser cavity with an optical path;
an amplifying path connected to the input and passing through the laser cavity for propagating the optical signals received at the input;
a pump input connected to the laser cavity for receiving a pump for exceeding a lasing threshold for the laser cavity; and
wherein the first LSOA laser output outputs the first laser output optical signal in response to the received optical signals propagating through the amplifying path.

13. An apparatus for recovering a clock signal from an optical input signal, comprising:
an optical AND gate, comprising:
a first input for receiving the input optical signal;
a second input for receiving a second input optical signal; and
an output for outputting an AND gate output optical signal in response to the first input optical signal and the second input optical signal, the AND gate output optical signal being a feedback signal;
a feedback controller for generating a control signal, comprising:
an input connected to the optical AND gate output for receiving the feedback signal; and
an output for outputting the control signal in response to the feedback signal;
a variable oscillator for generating a clock signal, comprising an input connected to the feedback controller for receiving the control signal; and
an output connected to the second input of the optical AND gate for outputting the clock signal in response to the control signal; and
an output connected to the output of the variable oscillator for outputting the clock signal generated by the variable oscillator.

14. The apparatus of claim 13, wherein the clock signal generated by the variable oscillator is the clock signal recovered from the optical input signal.

15. The apparatus of claim 13, wherein the feedback controller comprises:
a detector connected to the optical AN) gate output for receiving the feedback signal and detecting the received feedback signal; and
a low pass filter connected to the detector and the variable oscillator for generating the control signal in response to the feedback signal.

16. The apparatus of claim 13, wherein the variable oscillator is an optical astable multivibrator.

17. An optical retimer for retiming an input optical signal, comprising:
a first input for receiving the input optical signal;
a second input for receiving an optical clock signal;
a combiner connected to the first input and the second input for receiving the input optical signal and the optical clock signal and outputting a combined optical signal, the combined optical signal being a combination of the input optical signal and the optical clock signal;
an optical retimer output for outputting an optical retimer output signal;
a first lasing semiconductor optical amplifier (LSOA), comprising:
an input connected to the combiner for receiving optical signals; and a laser output connected to the optical retimer output for outputting
a first laser output optical signal in response to the received optical signals;
a second LSOA, comprising:
an input connected to the combiner for receiving optical signals, and
a laser output for outputting a second laser output optical signal in response to the received optical signals;
a third LSOA, comprising:
an input connected to the laser output of the first LSOA and the laser output of the second LSOA for receiving optical signals; and
a laser output connected to the input of the second LSOA for outputting a third laser output optical signal in response to the received optical signals; and
where the optical retimer output signal is a retimed input optical signal.

18. The optical retimer of claim 17, wherein the input optical signal is a reshaped optical signal.

19. The optical retimer of claim 17, wherein optical clock signal is a clock signal recovered Horn the input optical signal.

20. An optical apparatus, comprising:
an input for receiving an input optical signal;
connected to the input, means for reshaping the input optical signal and outputting a reshaped optical signal;
connected to the input, means for recovering a clock signal Horn the input optical signal and outputting the recovered clock signal;

connected to the means for reshaping the input optical signal and the means for recovering the clock signal, means for receiving the reshaped optical signal and the recovered clock signal, retiming the reshaped optical signal, outputting a retimed reshaped optical signal; and connected to the means for retiming the reshaped optical signal, means for receiving the retimed reshaped optical signal and retransmitting the retimed reshaped optical signal.

21. A method for reshaping an input optical signal, using a first lasing semiconductor optical amplifier (LSOA), a second LSOA, and a third LSOA, each of the first, second, and third LSOAs comprising an input, an output, a laser cavity with an optical path, an amplifying path connected to the input and passing through the laser cavity, and a laser output, the laser output of the first LSOA being connected to the input of the third LSOA, the laser output of the second LSOA being connected to the input of the third LSOA, and the laser output of the third LSOA being connected to the input of the second LSOA, comprising the steps of:

pumping the laser cavity of the first LSOA to exceed a lasing threshold for the laser cavity;

pumping the laser cavity of the second LSOA to exceed a lasing threshold for the laser cavity;

pumping the laser cavity of the third LSOA to exceed a lasing threshold for the laser cavity;

receiving the input optical signal at the input of the first LSOA;

propagating the input optical signal along the amplifying path of the first LSOA;

in response to the input optical signals propagating along the amplifying path of the first LSOA, outputting from the laser output of the first LSOA a first laser output optical signal;

receiving the input optical signal and a third laser output signal at the input of the second LSOA;

propagating the input optical signal and the third laser output signal along the amplifying path of the second LSOA;

in response to the input optical signal and the third laser output signal propagating along the amplifying path of the second LSOA, outputting from the laser output of the second LSOA a second laser output signal;

receiving the first laser output signal and the second laser output signal at the input of the third LSOA;

propagating the first laser output signal and the second laser output signal along the amplifying path of the third LSOA;

in response to the first laser output signal and the second laser output signal propagating along the amplifying path of the second LSOA, outputting from the laser output of the second LSOA a third laser output signal; and where the third laser output signal is the input optical signal reshaped.

22. The method of claim 21, wherein the third laser output signal is low when the input optical signal is below a depletion threshold for the first LSOA.

23. The method of claim 21, wherein the third laser output signal is high when the input optical signal is above a depletion threshold for the first LSOA.

24. A method for reshaping an input optical signal, using a first lasing semiconductor optical amplifier (LSOA), a second LSOA, and a third LSOA, each of the first, second, and third LSOAs comprising an input, an output, a laser cavity with an optical path, an amplifying path connected to the input and passing through the laser cavity, and a laser output, the laser output of the first LSOA being connected to the input of the third LSOA, the laser output of the second LSOA being connected to the input of the third LSOA, and the laser output of the third LSOA being connected to the input of the second LSOA, comprising the steps of:

receiving the input optical signal at the input of the first LSOA;

receiving a bias optical signal at the input of the first LSOA;

in response to receiving the input optical signal and the bias optical signal, outputting from the laser output of the first LSOA a first laser output optical signal; receiving the input optical signal, the bias optical signal, and a third laser output signal at the input of the second LSOA;

in response to receiving the input optical signal, the bias optical signal, and the third laser output signal, outputting from the laser output of the second LSOA a second laser output signal;

receiving the first laser output signal and the second laser output signal at the input of the third LSOA;

in response to receiving the first laser output signal and the second laser output signal, outputting from the laser output of the second LSOA a third laser output signal; and where the third laser output signal is the input optical signal reshaped.

25. The method of claim 24, wherein the third laser output signal is low when the input optical signal combined with the bias optical signal is below a depletion threshold for the first LSOA.

26. The method of claim 24, wherein the third laser output signal is high when the input optical signal combined with the bias optical signal is above a depletion threshold for the first LSOA.

27. A method for recovering a clock signal from an input optical signal, comprising the steps of:

receiving the input optical signal at a first input of an optical AND gate; receiving a clock signal at a second input of the optical AND gate;

generating a feedback signal in response to the input optical signal and the clock signal;

generating a control signal in response to the feedback signal;

generating the clock signal in response to the control signal; and signal is the clock signal recovered from the input optical signal.

* * * * *

UNITED STATES PATENT AND TRADEMARK OFFICE
CERTIFICATE OF CORRECTION

PATENT NO. : 6,765,715 B1
APPLICATION NO. : 10/029523
DATED : July 20, 2004
INVENTOR(S) : DiJaili et al.

It is certified that error appears in the above-identified patent and that said Letters Patent is hereby corrected as shown below:

Title Page,
Item (56), under "OTHER PUBLICATIONS", line 1, after "Alcatel Optronics Introduces" change "as" to --a--
Item (57), under "ABSTRACT", line 2, change "register" to --regenerator--

Column 2,
Line 23, after "depletion" insert --threshold--

Column 3,
Line 38, after "source 106 is" remove [a)]
Line 49, before "Both" change "input" to --input.--
Line 59, after "detector" change "10" to --110--
Line 60, after "detector" change "10" to --110--

Column 6,
Line 25, after "difference" change "At" to --$\Delta t$--
Line 33, after "difference" change "$\Delta$" to --$\Delta t$--

Column 7,
Line 7, after "The" remove [At]
Line 9, after "OAND gate" change "16" to --116--

Column 8,
Line 39, after "706" change "an d" to --and--

Column 9,
Line 41, after "example" change "IAlGaAs" to --InAlGaAs--
Line 42, before "on GaAs," change "MGaAs" to --InAlGaAs--

Column 12,
Line 46, before "1006" change "VISOAs" to --VLSOAs--
Line 48, after "combiner" change "101" to --1011--
Line 56, before "by using VLSOAs" change "embodiment" to --embodiments--

Column 13,
Line 13, before "optical AND" change "and" to --an--

Column 15,
Line 39, change "FIG. 1" to --FIG. 11--

UNITED STATES PATENT AND TRADEMARK OFFICE
CERTIFICATE OF CORRECTION

PATENT NO.       : 6,765,715 B1
APPLICATION NO.  : 10/029523
DATED            : July 20, 2004
INVENTOR(S)      : DiJaili et al.

It is certified that error appears in the above-identified patent and that said Letters Patent is hereby corrected as shown below:

Column 16,
Line 25, after "refractive index," change "of" to --or--
Line 30, after "wavelength" change "24," to --$\lambda_{11}$--.
Line 43, after "wavelength;" change "(f" to --(f)--

Column 17,
Line 13, after "parallel" remove [in]
Line 43, change "Fin-Keldysh" to --Franz-Keldysh--

Column 19,
Line 32, after "received" change "a" to --at--

Column 20,
Line 14, after "optical" change "AN)" to --AND--
Line 58, after "recovered" change "Horn" to --from--
Line 65, after "signal" change "Horn" to --from--

Column 22,
Line 58, before "signal is the clock" insert --where the clock--

Signed and Sealed this

Twenty-second Day of August, 2006

JON W. DUDAS
*Director of the United States Patent and Trademark Office*